United States Patent
Park et al.

(10) Patent No.: US 11,777,064 B2
(45) Date of Patent: Oct. 3, 2023

(54) DISPLAY DEVICE AND METHOD OF REPAIRING DISPLAY DEVICE

(71) Applicant: Samsung Display Co., Ltd., Yongin-si (KR)

(72) Inventors: Ill Won Park, Asan-si (KR); Ki Dae Shin, Asan-si (KR); Joong Keun Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 193 days.

(21) Appl. No.: 17/026,941

(22) Filed: Sep. 21, 2020

(65) Prior Publication Data

US 2021/0280750 A1 Sep. 9, 2021

(30) Foreign Application Priority Data

Mar. 9, 2020 (KR) .................. 10-2020-0028874

(51) Int. Cl.
*H01L 33/50* (2010.01)
*H01L 33/00* (2010.01)
*H10K 50/80* (2023.01)
*H10K 71/00* (2023.01)

(52) U.S. Cl.
CPC ........ *H01L 33/504* (2013.01); *H01L 33/0095* (2013.01); *H10K 50/80* (2023.02); *H10K 71/00* (2023.02); *H01L 2933/0041* (2013.01)

(58) Field of Classification Search
CPC ............. H01L 27/322; H01L 2251/568; H01L 2933/0041; H01L 51/56
See application file for complete search history.

(56) References Cited

U.S. PATENT DOCUMENTS

| | | | | |
|---|---|---|---|---|
| 6,771,028 B1 * | 8/2004 | Winters | ............... | H01L 27/3276 315/169.3 |
| 7,491,477 B2 * | 2/2009 | Fukai | ................. | G02F 1/133516 430/7 |
| 8,273,423 B2 * | 9/2012 | Yoshioka | ............... | G02B 5/201 430/7 |
| 2002/0135296 A1 * | 9/2002 | Aziz | ...................... | H01L 51/529 313/506 |
| 2004/0002277 A1 * | 1/2004 | Kuo | .................. | H01L 21/67207 445/2 |
| 2011/0227104 A1 * | 9/2011 | Miyazawa | .............. | H01L 51/56 257/89 |
| 2011/0273377 A1 * | 11/2011 | Merz | ....................... | G09G 5/003 345/173 |

(Continued)

FOREIGN PATENT DOCUMENTS

KR 10-2006-0030536 A 4/2006
KR 10-1076430 B1 10/2011

(Continued)

*Primary Examiner* — Ratisha Mehta
(74) *Attorney, Agent, or Firm* — Lewis Roca Rothgerber Christie LLP

(57) ABSTRACT

A method of repairing a display device, in which the display device includes a defective pixel area including a defective wavelength conversion patter, the method including removing the defective wavelength conversion pattern of the defective pixel area, injecting ink including a wavelength conversion material into the defective pixel area, and curing the ink injected into the defective pixel area.

20 Claims, 22 Drawing Sheets

(56) References Cited

U.S. PATENT DOCUMENTS

| | | | |
|---|---|---|---|
| 2013/0115385 A1* | 5/2013 | Okumoto | B05D 5/06 427/162 |
| 2014/0191202 A1* | 7/2014 | Shim | H01L 51/56 257/40 |
| 2017/0331041 A1* | 11/2017 | Hiraoka | H01L 51/0014 |
| 2018/0122878 A1* | 5/2018 | Kim | H01L 27/3248 |

FOREIGN PATENT DOCUMENTS

| | | |
|---|---|---|
| KR | 10-1133072 B1 | 4/2012 |
| KR | 10-2018-0066936 A | 6/2018 |
| KR | 10-2019-0093823 A | 8/2019 |

* cited by examiner

FIG. 2
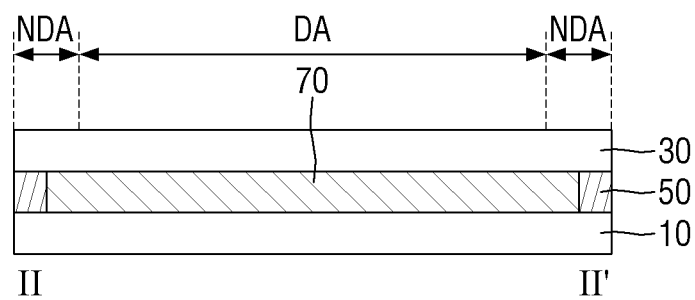
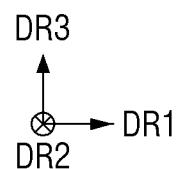

DISPLAY DEVICE AND METHOD OF REPAIRING DISPLAY DEVICE

CROSS-REFERENCE TO RELATED APPLICATION

This application claims priority to and the benefit of Korean Patent Application No. 10-2020-0028874, filed on Mar. 9, 2020, the entire disclosure of which is hereby incorporated by reference.

BACKGROUND

1. Field

The present disclosure relates to a display device and a method of repairing a display device.

2. Description of the Related Art

The importance of a display device has increased with the development of multimedia. Accordingly, various types of display devices, such as a liquid crystal display (LCD) and an organic light emitting display (OLED), have been developed.

Among these display devices, a self-light emitting display device includes a self-light emitting element, for example, an organic light emitting element. The self-light emitting element may include two electrodes facing each other and a light emitting layer interposed therebetween. When the self-light emitting element is an organic light emitting element, electrons and holes provided from the two electrodes are recombined with each other in the light emitting layer to generate excitons, and the generated excitons are changed from an excited state to a ground state to emit light.

Because such a self-light emitting display device does not need an additional light source, it has low power consumption and may be made light and thin, and it has high-level characteristics such as a wide viewing angle, high luminance and contrast, and rapid response speed, so that it is attracting considerable attention as a next-generation display device.

Meanwhile, when a display device is manufactured and then tested to evaluate display quality, adjacent wavelength conversion patterns are mixed with each other. Thus, defects that some sub-pixels are recognized as dark spots (e.g., defects in sub-pixels that result in dark spots) may be found. The phenomenon that the adjacent wavelength conversion patterns are mixed with each other may occur due to a mis-injection of ink that may occur during an inkjet process of forming wavelength conversion patterns or due to defects of partition walls for partitioning wavelength conversion patterns and light transmission patterns, and the like.

Therefore, a repair process of reforming wavelength conversion patterns disposed in defective sub-pixels into normal wavelength conversion patterns may be performed, thereby reducing or minimizing the deterioration in quality of a display device.

SUMMARY

An aspect of the present disclosure is directed toward a method of repairing a display device, in which defective wavelength conversion patterns are repaired to form normal wavelength conversion patterns (hereinafter, repair patterns), thereby improving the reliability of display quality of the display device.

Another aspect of the present disclosure is directed toward a display device in which display quality is improved by repairing defective wavelength conversion patterns.

However, aspects of the present disclosure are not restricted or limited to the ones set forth herein. The above and other aspects of the present disclosure will become more apparent to one of ordinary skill in the art to which the present disclosure pertains by referencing the detailed description of the present disclosure given below.

According to an embodiment of the present disclosure, a method of repairing a display device, in which the display device includes a defective pixel area including a defective wavelength conversion pattern, the method includes removing the defective wavelength conversion pattern of the defective pixel area, injecting ink including a wavelength conversion material into the defective pixel area, and curing the ink injected into the defective pixel area.

In an example embodiment, in the removing of the defective wavelength conversion pattern, the defective wavelength conversion pattern is removed by irradiating the defective wavelength conversion pattern with a laser beam.

In an example embodiment, the laser beam is applied utilizing a laser unit, and the laser unit includes a nano laser or a femtosecond laser.

In an example embodiment, the display device further includes a substrate, a color filter on a surface of the substrate, and a partition wall on a surface of the color filter, and the defective wavelength conversion pattern is on a surface of the color filter in a space partitioned by the partition wall.

In an example embodiment, in the removing of the defective wavelength conversion pattern, the defective wavelength conversion pattern is removed by irradiating the defective pixel area with a laser beam to selectively remove only the defective wavelength conversion pattern without removing the color filter.

In an example embodiment, the color filter is to selectively transmit light of a first color, and the wavelength conversion material includes a material to convert light of a second color different from the first color into light of the first color.

In an example embodiment, the removing of the defective wavelength conversion pattern includes: forming a groove in the defective pixel area by removing the defective wavelength conversion pattern, and the injecting of the ink includes: forming a repair material layer including the wavelength conversion material by filling the groove with the ink including the wavelength conversion material.

In an example embodiment, the curing of the ink includes: forming a repair pattern by irradiating the repair material layer with light.

In an example embodiment, the method includes inspecting a height of the repair pattern after forming the repair pattern.

In an example embodiment, the curing of the ink includes: applying light to the ink in a state in which gas is introduced in the defective pixel area.

In an example embodiment, the method includes detecting a pixel area in which a defect has occurred before removing the defective wavelength conversion pattern.

According to an embodiment of the present disclosure, a method of repairing a display device, in which the display device includes a mixed wavelength conversion pattern, the method includes removing the mixed wavelength conversion pattern; and forming a repair pattern in a groove formed by the removing of the mixed wavelength conversion pattern.

In an example embodiment, the mixed wavelength conversion pattern includes a first wavelength conversion material to convert light of a first color into light of a second color and a second wavelength conversion material to convert the light of the first color into light of a third color, and the repair pattern includes the first wavelength conversion material and does not include the second wavelength conversion material.

In an example embodiment, the removing of the mixed wavelength conversion pattern includes: irradiating the mixed wavelength conversion pattern with a laser beam.

In an example embodiment, the forming of the repair pattern includes: forming a repair material layer including the first wavelength conversion material in the groove; and forming the repair pattern by curing the repair material layer.

In an example embodiment, the forming of the repair material layer in the groove includes injecting ink including the first wavelength conversion material into the groove.

According to an embodiment of the present disclosure, a display device including a pixel which includes a first sub-pixel configured to display a first color, and a second sub-pixel configured to display a second color, the display device includes a color conversion substrate, the color conversion substrate includes a first substrate, a color control layer on a surface of the first substrate and including a first wavelength conversion pattern belonging to the first sub-pixel and a repair pattern belonging to the second sub-pixel, and a mixed wavelength conversion layer between the first substrate and the repair pattern.

In an example embodiment, the mixed wavelength conversion layer includes a first wavelength conversion material to convert light of a third color into light of the first color and a second wavelength conversion material to convert light of the third color into light of the second color, and the repair pattern includes the second wavelength conversion material and does not include the first wavelength conversion material.

In an example embodiment, the display device includes a display substrate to face the color conversion substrate, wherein the display substrate includes: a second substrate facing the first substrate, a sub-pixel electrode on a surface of the second substrate facing the first substrate and provided for each sub-pixel, a pixel defining layer on the second substrate along a boundary of the sub-pixel and exposing the sub-pixel electrode, a light emitting layer on the sub-pixel electrode exposed by the pixel defining layer, and a common electrode on the light emitting layer.

In an example embodiment, the pixel further includes a third sub-pixel configured to display a third color, and the color control layer further includes a light transmission pattern belonging to the third sub-pixel.

According to a method of repairing a display device of an embodiment, a wavelength conversion pattern having defects (hereinafter, a defective wavelength conversion pattern or a mixed wavelength conversion pattern) may be selectively removed to form a normal wavelength conversion pattern (hereinafter, a repair pattern), thereby improving the light efficiency and display quality of a display device.

According to a display device of an embodiment, a defective wavelength pattern disposed in a defective sub-pixel is repaired into a repair pattern to decrease the number of dark spots that may occur in the defective sub-pixel, thereby improving the light efficiency and display quality of a display device.

The aspects of the present disclosure are not limited by the foregoing, and other various aspects are anticipated herein.

Although example embodiments of the present disclosure have been disclosed for illustrative purposes, those of ordinary skill in the art will appreciate that various suitable modifications, additions and/or substitutions are possible, without departing from the scope and spirit of the present disclosure as disclosed in the accompanying claims and equivalents thereof.

BRIEF DESCRIPTION OF THE DRAWINGS

The above and other aspects and features of the present disclosure will become more apparent by describing in more detail example embodiments thereof with reference to the attached drawings, in which:

FIG. 2 is a cross-sectional view of a display device taken along the line II-II' of FIG. 1;

DETAILED DESCRIPTION

The present disclosure will now be described more fully hereinafter with reference to the accompanying drawings, in which example embodiments of the present disclosure are shown. This present disclosure may, however, be embodied in different forms and should not be construed as limited to the embodiments set forth herein. Rather, these embodiments are provided so that this disclosure will be thorough and complete, and will fully convey the scope of the present disclosure to those of ordinary skill in the art.

It will also be understood that when an element or layer is referred to as being "on" another element, layer or substrate, it can be directly on the other element, layer or substrate, or an intervening element(s) or layer(s) may also be present. In contrast, when an element or layer is referred to as being "directly on" another element or layer, there is no intervening element(s) or layer(s) present.

The same reference numbers indicate the same components throughout the specification. In the attached figures, the thickness of layers and regions may be exaggerated for clarity. As used herein, the use of the term "may," when describing embodiments of the present disclosure, refers to "one or more embodiments of the present disclosure." As used herein, the term "and/or" includes any and all combinations of one or more of the associated listed items. As used herein, the term "substantially," "about," "approximately," and similar terms are used as terms of approximation and not as terms of degree, and are intended to account for the inherent deviations in measured or calculated values that would be recognized by those of ordinary skill in the art.

Hereinafter, embodiments of the present disclosure will be described with reference to the attached drawings.

Figure 1:
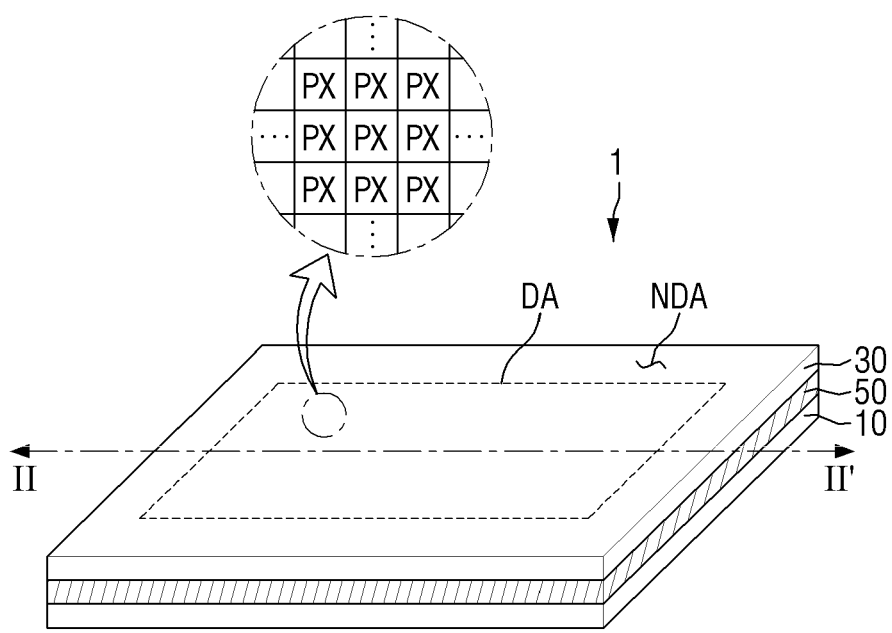
FIG. 1 is a perspective view of a display device according to an embodiment.

FIG. 1 is a perspective view of a display device according to an embodiment, and FIG. 2 is a cross-sectional view of a display device taken along the line II-II' of FIG. 1.

Referring to FIGS. 1 and 2, the display device 1 may refer to any suitable electronic device that provides a display screen. Examples of the display device 1 may include televisions, notebook computers, monitors, billboards, mobile phones, smart phones, tablet personal computers (PCs), electronic clocks, smart watches, watch phones, mobile communication terminals, electronic notes, electronic books, portable multimedia players (PMPs), navigators, game machines, digital cameras, and things of internet (IoTs).

In the drawings, the first direction DR1, the second direction DR2, and the third direction DR3 are defined. The first direction DR1 and the second direction DR2 may be directions perpendicular to each other in one plane. The third direction DR3 may be a direction perpendicular to a plane in which the first direction DR1 and the second direction DR2 are located. The third direction DR3 is perpendicular to each of the first direction DR1 and the second direction DR2. In some embodiments, the third direction DR3 indicates a thickness direction of the display device 1.

In the following embodiments, unless otherwise specified, "on" or "over" indicates a display direction in one side of the third direction DR3 (e.g., positive DR3 direction), and similarly, "upper surface" indicates a surface facing one side of the third direction DR3 (e.g., positive DR3 direction). Further, "beneath" or "under" indicates a direction opposite to the display direction in the other side of the third direction DR3 (e.g., negative DR3 direction), and similarly, "lower surface" indicates a surface facing the other side of the third direction DR3 (e.g., negative DR3 direction).

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The display device 1 may have a rectangular shape on a plane. For example, the display device 1 may have a rectangular planar shape having long sides in the first direction DR1 and short sides in the second direction DR2. The edge of the display device where the long side in the first direction DR1 meets (e.g., crosses or intersects) the short side in the second direction DR2 may be formed at a right angle or may be rounded to have a set or predetermined curvature. However, the planar shape of the display device 1 is not limited to that illustrated, and may be applied in a circular shape or other shapes. For example, the planar shape of the display device 1 may be any suitable shape.

The display device 1 may include a display area DA in which an image is displayed, and a non-display area NDA in which an image is not displayed. The display area DA may include a plurality of pixels PX. The non-display area NDA may be located around the display area DA (e.g., may be located adjacent to the display area DA), and may partially or entirely surround the display area DA.

The display device 1 may include a display substrate 10 and a color conversion substrate 30 facing the display substrate 10. For example, the color conversion substrate 30 and the display substrate 10 may partially or entirely overlap each other in the third direction DR3. The display device 1 may further include a sealing member 50 coupling the display substrate 10 and the color conversion substrate 30, and a filling layer 70 charged between (e.g., located between) the display substrate 10 and the color conversion substrate 30.

The display substrate 10 may emit light having a set or predetermined peak wavelength from a plurality of light emitting areas of the display area DA. The display substrate 10 may include elements and circuits for displaying an image. For example, the display substrate may include a pixel circuit such as a switching element, a pixel defining layer defining light emitting areas and a non-light emitting area of the display area DA, and a self-light emitting element.

For example, the self-light emitting element may include at least one selected from among an organic light emitting diode, a quantum dot light emitting diode, an inorganic-based micro light emitting diode (for example, micro LED), and an inorganic-based nano light emitting diode (For example, nano LED). Hereinafter, a case where the self-light emitting element is an organic light emitting diode will be described as an example. However, the present disclosure is not limited thereto.

The color conversion substrate 30 may be disposed over the display substrate 10 and may face the display substrate 10. The color conversion substrate 30 may convert the peak wavelength of light emitted from the display substrate 10 and transmit the light, or may maintain the peak wavelength of light emitted from the display substrate 10 and transmit the light. For example, the display substrate 10 may emit light having a set or predetermined peak wavelength, and the color conversion substrate 30 may transmit at least two lights having different peak wavelengths. For example, the display substrate 10 may emit blue light and the color conversion substrate 30 may convert at least a portion of the blue light and may transmit blue, green, and/or red light.

The sealing member 50 may be disposed along the edges of the display substrate 10 and the color conversion substrate 30 in the non-display area NDA, and may be interposed between the display substrate 10 and the color conversion substrate 30. The sealing member 50 may surround the display area DA in a plan view. The display substrate 10 and the color conversion substrate 30 may be coupled to each other through the sealing member 50. For example, the sealing member 50 may include (e.g., be) an organic material. The sealing member 50 may be made of an epoxy resin, but the material thereof is not limited thereto.

The filling layer 70 may be disposed in a space between the display substrate 10 and the color conversion substrate 30 which are surrounded by the sealing member 50. For example, the filling layer 70 may be encapsulated by the display substrate 10 below, the color conversion substrate 30 above, and the sealing member 50 at the sides. The filling layer 70 may fill the space between the display substrate 10 and the color conversion substrate 30. The filling layer 70 may be made of a light-transmittable material (e.g., transparent material). The filling layer 70 may include (e.g., be) an organic material. For example, the filling layer 70 may be made of a silicon (Si)-based organic material and/or an epoxy-based organic material, but the material thereof is not limited thereto.

Figure 3:
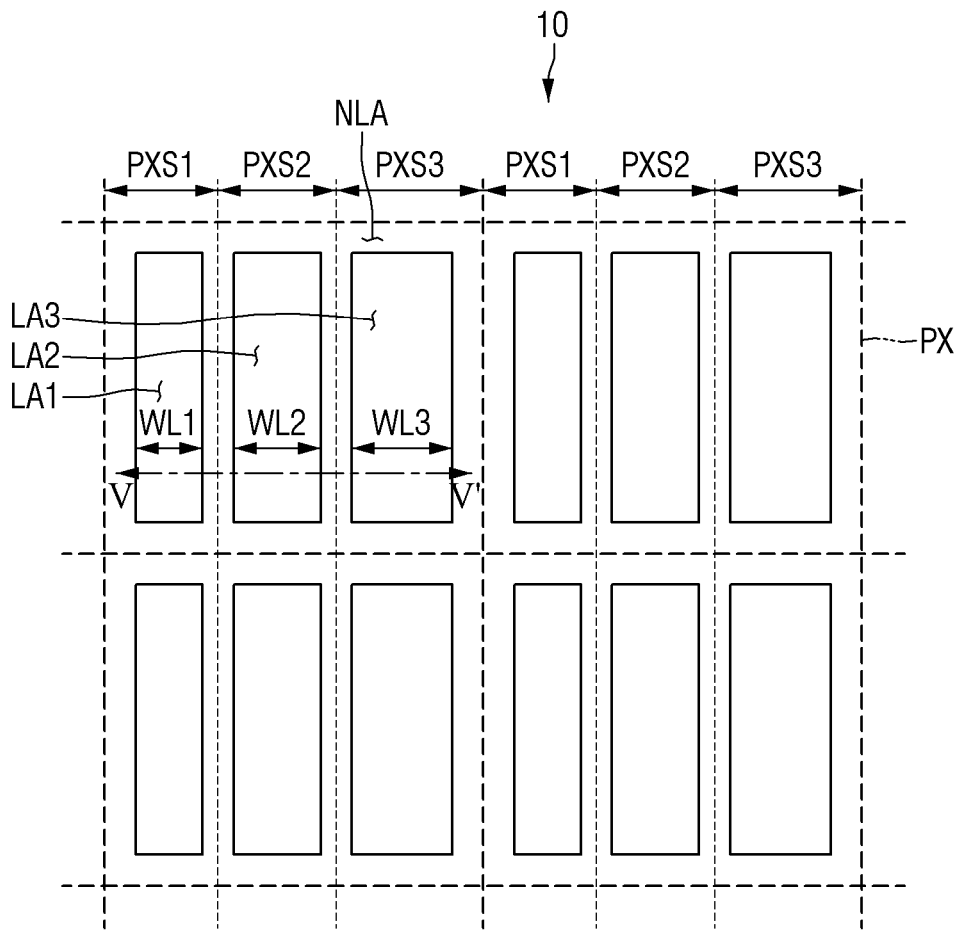
FIG. 3 is a schematic layout view of a pixel arrangement of a display substrate according to an embodiment.

FIG. 3 is a schematic layout view of a pixel arrangement of a display substrate according to an embodiment.

Referring to FIGS. 1 to 3, the display area DA of the display device 1 includes a plurality of pixels PXs arranged along a plurality of rows and a plurality of columns. The pixel PX means a repeating minimum unit for display. In order for full color display, each pixel PX may include a plurality of sub-pixels PXS (PXS1, PXS2, and PXS3) to emit light of different colors. For example, each pixel PX includes a first sub-pixel PXS1 to emit blue light, a second sub-pixel PXS2 to emit green light, and a third sub-pixel PXS3 to emit red light.

The first sub-pixel PXS1, the second sub-pixel PXS2, and the third sub-pixel PXS3 may be provided for (e.g., included in) each pixel PX. The sub-pixels PXS1, PXS2, and PXS3 may be sequentially arranged in order of the first sub-pixel PXS1, the second sub-pixel PXS2, and the third sub-pixel PXS3 along the first direction DR1.

Each pixel PX of the display substrate 10 may include a plurality of light emitting areas LA (LA1, LA2, and LA3) and a non-light emitting area NLA.

The light emitting area LA may be an area in which light generated from the display substrate 10 is emitted to the outside of the display substrate 10, and the non-light emitting area NLA may be an area in which light generated from the display substrate 10 is not emitted to the outside of the display substrate 10.

The plurality of light emitting areas LA (LA1, LA2, and LA3) may include a first light emitting area LA1, a second light emitting area LA2, and a third light emitting area LA3. The first to third light emitting areas LA1, LA2, and LA3 may be light emitting areas LA of the first to third sub-pixels PXS1, PXS2, and PXS3, respectively. For example, the first light emitting area LA1 is a light emitting area LA of the first sub-pixel PXS1, the second light emitting area LA2 is a light emitting area LA of the second sub-pixel PXS2, and the third light emitting area LA3 may be a light emitting area LA of the third sub-pixel PXS3.

Light emitted from the first to third light emitting areas LA1, LA2, and LA3 to the outside of the display substrate 10 may be light having a set or predetermined peak wavelength. For example, the first to third light emitting areas LA1, LA2, and LA3 may emit blue light. The light emitted from the first to third light emitting areas LA1, LA2, and LA3 may have a peak wavelength ranging from 440 nm to 480 nm. As used herein, the term "nm" may refer to a distance equal to $10^{-9}$ meters.

The first to third light emitting areas LA1, LA2, and LA3 may be sequentially arranged in the display area DA of the display substrate 10 along the first direction DR1. The planar shape of each of the first to third light emitting areas LA1, LA2, and LA3 may be a rectangle in which the width in the second direction DR2 is longer than the width in the first direction DR1, but is not limited thereto.

In an example embodiment, the width WL1 of the first light emitting area LA1 in the first direction DR1 may be smaller than the width WL2 of the second light emitting area LA2 in the first direction DR1 and may be smaller than the width WL3 of the third light emitting area LA3 in the first direction DR1. The width WL2 of the second light emitting area LA2 in the first direction DR1 may be smaller than the width WL3 of the third light emitting area LA3 in the first direction DR1. However, the relationship among the widths WL1, WL2, and WL3 of the first to third light emitting areas LA1, LA2, and LA3 in the first direction DR1 is not limited to the embodiment illustrated in FIG. 3. For example, the width WL1 of the first light emitting area LA1 in the first direction DR1, the width WL2 of the second light emitting area LA2 in the first direction DR1, and the width WL3 of the third light emitting area LA3 in the first direction DR1 may be substantially the same as each other.

In some embodiments, the area (e.g., planar area) of the first light emitting area LA1 may be smaller than the area of the second light emitting area LA2 and may be smaller than the area of the third light emitting area LA3. The area of the second light emitting area LA2 may be smaller than the area of the third light emitting area LA3. However, the present disclosure is not limited thereto. For example, the area of the first light emitting area LA1, the second light emitting area LA2, and the third light emitting area LA3 may be substantially the same as each other.

The non-light emitting area NLA may be arranged to surround the plurality of light emitting areas LA (LA1, LA2, and LA3).

The non-light emitting area NLA of one sub-pixel PXS contacts the non-light emitting area NLA of a neighboring sub-pixel PXS (regardless of whether it is a sub-pixel PXS in the same pixel PX). The non-light emitting areas NLA of the neighboring sub-pixels PXS may be connected as one. Moreover, the non-light emitting areas NLA of all of the sub-pixels PXS may be connected as one, but the present disclosure is not limited thereto. The light emitting areas LA1, LA2, and LA3 of each of the neighboring sub-pixels PXS may be divided (e.g., separated or spaced apart) by the non-light emitting area NLA.

Figure 4:
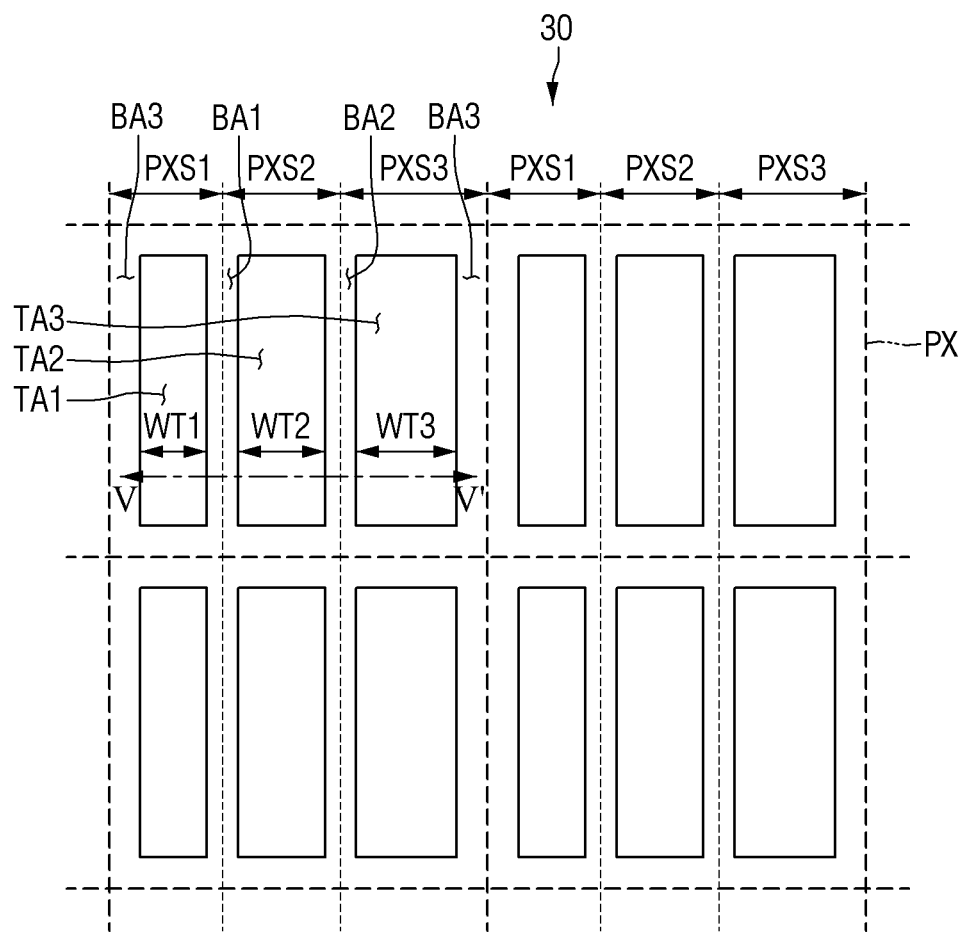
FIG. 4 is a schematic layout view of a pixel arrangement of a color conversion substrate according to an embodiment.

FIG. 4 is a schematic layout view of a pixel arrangement of a color conversion substrate according to an embodiment.

Referring to FIG. 4 together with FIGS. 1 and 2, each pixel PX of the color conversion substrate 30 may include a plurality of light transmitting areas TA (TA1, TA2, and TA3) and a plurality of light blocking areas BA (BA1, BA2, and BA3).

The light transmitting area TA may be an area where light emitted from the display substrate 10 transmits (e.g., transmits through) the color conversion substrate 30 and is emitted to the outside of the display device 1, and the light blocking area BA may be an area in which light emitted from the display substrate 10 is not transmitted. For example, the light blocking area BA may be an area where light emitted from the display substrate 10 is blocked.

The plurality of light transmitting areas TA: TA1, TA2, and TA3 may include a first light transmitting area TA1, a second light transmitting area TA2, and a third light transmitting area TA3. The first to third light transmitting areas TA1, TA2, and TA3 may be light transmitting areas TA of (e.g., corresponding to) the first to third sub-pixels PXS1, PXS2, and PXS3, respectively. For example, the first light transmitting area TA1 is a light transmitting area TA of the first sub-pixel PXS1, the second light transmitting area TA2 is a light transmitting area TA of the second sub-pixel PXS2, and the third light transmitting area TA3 may be a light transmitting area TA of the third sub-pixel PXS3. The first to third light transmitting areas TA1, TA2, and TA3 may correspond to the first to third light emitting areas LA1, LA2, and LA3 of the display substrate 10, respectively.

Light emitted from the light emitting areas LA1, LA2, and LA3 of the display substrate 10 may respectively transmit (e.g., pass through) the first to third light transmitting areas TA1, TA2, and TA3 of the color conversion substrate 30 and may be emitted to the outside of the display device 1. The first light transmitting area TA1 may emit light of a first color to the outside of the display device 1, the second light transmitting area TA2 may emit light of a second color different from the first color to the outside of the display device 1, and the third light transmitting area TA3 may emit light of a third color different from the first color and the second color to the outside of the display device 1. For example, the light of the first color may be blue light having a peak wavelength ranging from 440 nm to about 480 nm, the light of the second color may be green light having a peak wavelength ranging 510 nm to 550 nm, and the light of the third color may be red light having a peak wavelength ranging from 610 nm to 650 nm.

The first to third light transmitting areas TA1, TA2, and TA3 may be sequentially arranged in the display area DA of the color conversion substrate 30 along the first direction DR1. The planar shapes of the first to third light transmitting areas TA1, TA2, and TA3 may be similar to the planar shapes of the first to third light emitting areas LA1, LA2, and LA3, but the present disclosure is not limited thereto. In some embodiments, the planar shapes of the first to third light transmitting areas TA1, TA2, and TA3 may correspond to the planar shapes of the first to third light emitting areas LA1, LA2, and LA3, respectively.

In an example embodiment, the width WT1 of the first light transmitting area TA1 in the first direction DR1 may be smaller than the width WT2 of the second light transmitting area TA2 in the first direction DR1 and may be smaller than the width WT3 of the third light transmitting area TA3 in the first direction DR1. The width WT2 of the second light transmitting area TA2 in the first direction DR1 may be smaller than the width WT3 of the third light transmitting area TA3 in the first direction DR1. However, the relationship among the widths WT1, WT2, and WT3 of the first to third light transmitting areas TA1, TA2, and TA3 in the first direction DR1 is not limited to the embodiment illustrated in FIG. 4. For example, the width WT1 of the first light transmitting area TA1 in the first direction DR1, the width WT2 of the second light transmitting area TA2 in the first direction DR1, and the width WT3 of the third light transmitting area TA3 in the first direction DR1 may be substantially the same as each other.

In some embodiments, the area (e.g., planar area) of the first light transmitting area TA1 may be smaller than the area of the second light transmitting area TA2 and may be smaller than the area of the third light transmitting area TA3. The area of the second light transmitting area TA2 may be smaller than the area of the third light transmitting area TA3. However, the present disclosure is not limited thereto. For example, the area of the first light transmitting area TA1, the second light transmitting area TA2, and the third light transmitting area TA3 may be substantially the same as each other.

The light blocking area BA may be disposed to surround the plurality of light transmitting areas TA. The light transmitting area TA of each neighboring sub-pixel PXS may be divided by the light blocking area BA.

The light blocking area BA may include a first light blocking area BA1, a second light blocking area BA2, and a third light blocking area BA3. The first to third light blocking areas BA1, BA2, and BA3 may be connected as one, but the present disclosure is not limited thereto.

The first light blocking area BA1 may be located between the first light transmitting area TA1 and the second light transmitting area TA2 along the first direction DR1, the second light blocking area BA2 may be located between the second light transmitting area TA2 and the third light transmitting area TA3 along the first direction DR1, and third light blocking area BA3 may be located between the third light transmitting area TA3 and the first light transmitting area TA1 along the first direction DR1. For example, the third light blocking area BA3 may be located between the third light transmitting area TA3 of a first pixel and a first light transmitting area TA1 of a second pixel adjacent to the first pixel in the first direction DR1. The first to third light blocking areas BA1, BA2, and BA3 may prevent or reduce the color mixing of light emitted from the first to third light transmitting areas TA1, TA2, and TA3.

Figure 5:
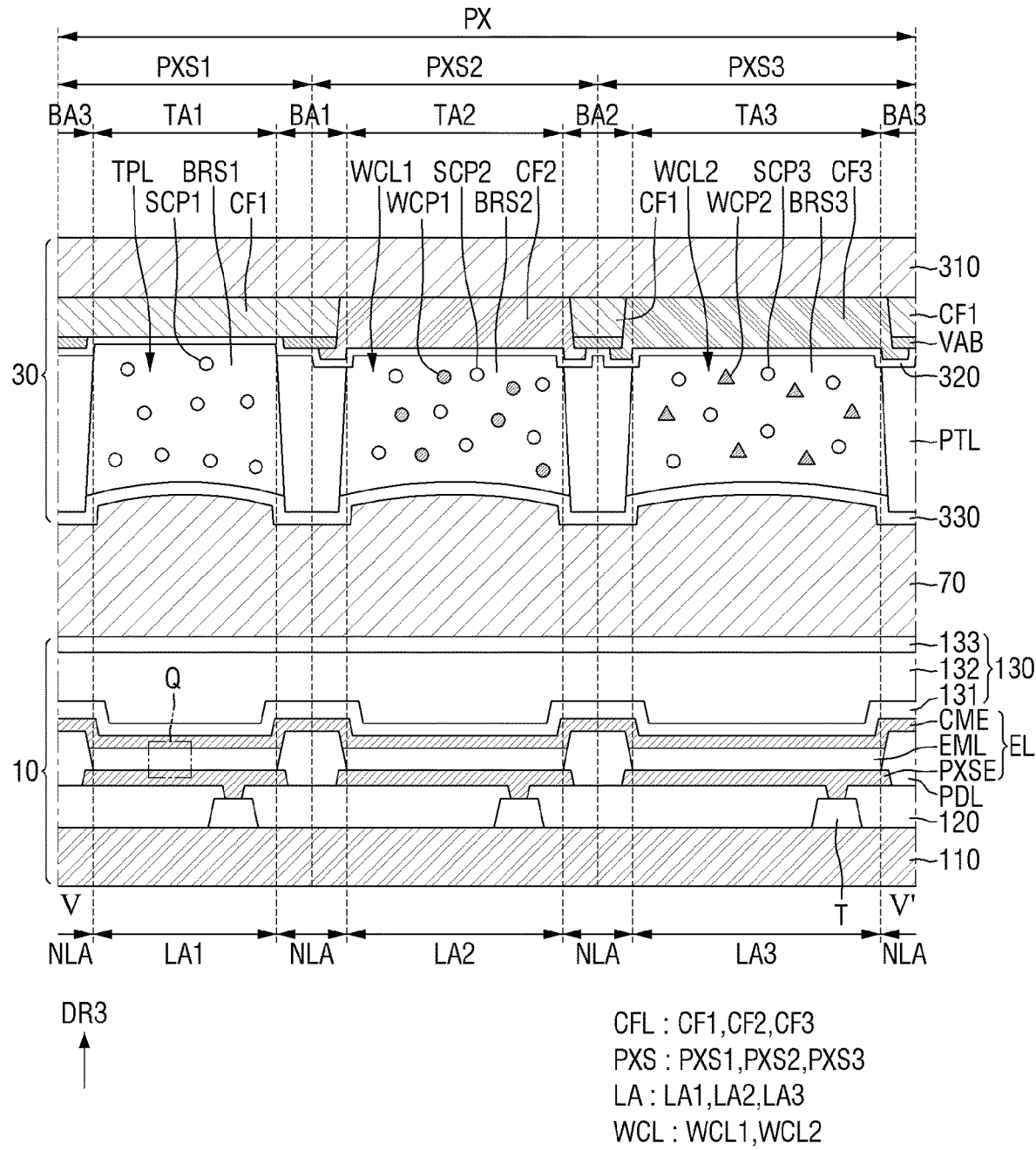
FIG. 5 is a cross-sectional view of a display device taken along the line V-V' of FIGS. 3 and 4.

FIG. 5 is a cross-sectional view of a display device taken along the line V-V' of FIGS. 3 and 4.

Referring to FIG. 5, the display substrate 10 may include a first substrate 110, and a switching element T, a plurality of light emitting elements EL, and a thin film encapsulation structure 130 covering the plurality of light emitting elements EL, which are disposed on the first substrate 110. The color conversion substrate 30 may include a second substrate 310 and color control structures CFL, WCL, and TPL disposed on a surface (e.g., lower surface) of the second substrate 310 facing the first substrate 110. The color control structures may include a wavelength conversion layer WCL and a light transmission pattern TPL disposed at the same level (e.g., height) as the wavelength conversion layer WCL in some sub-pixels. The color control structures may further include a color filter layer CFL. The filling layer 70 may be disposed between the thin film encapsulation structure 130 and the color control structures CFL, WCL, and TPL. As described above, the filling layer 70 may couple the display substrate 10 and the color conversion substrate 30 while filling the space between the display substrate 10 and the color conversion substrate 30.

The first substrate 110 may be an insulating substrate. The first substrate 110 may include (e.g., be) a transparent material. For example, the first substrate 110 may include (e.g., be) a transparent insulating material such as glass and/or quartz. The first substrate 110 may be a suitably rigid substrate. However, the first substrate 110 is not limited to that illustrated above. The first substrate 110 may include (e.g., be) plastic such as polyimide (PI), and may have suitably flexible characteristics capable of warping, bending, folding and/or rolling.

The switching element T may be disposed on a surface (e.g., upper surface) of the first substrate 110. The switching element T may be disposed for (e.g., correspond to) each sub-pixel PXS. The switching element T may be disposed in the light emitting area LA of each sub-pixel PXS. The switching element T may be disposed in each of the first to third light emitting areas LA1, LA2, and LA3 of the display substrate 10 in each sub-pixel PXS. However, the present disclosure is not limited thereto. For example, at least one of the switching elements T included in each sub-pixel PXS may be disposed in the non-light emitting area NLA.

The switching element T may be a thin film transistor including (e.g., being) polysilicone or a thin film transistor including (e.g., being) an oxide semiconductor. A plurality of signal lines (for example, gate lines, data lines, power lines, and the like) for transmitting signals to the switching element T may be further disposed on the first substrate 110.

An insulating film 120 may be disposed on the switching element T. In an example embodiment, the insulating film 120 may be a planarization film. The insulating film 120 may include an organic film. For example, the insulating film 120 may include (e.g., be) an organic material such as an acrylic resin, an epoxy resin, an imide resin, and/or an ester resin.

A light emitting element (or light emitting diode) EL may be disposed on the insulating film 120. The light emitting element EL may include a sub-pixel electrode PXSE, a light emitting layer EML, and a common electrode CME. Light emitted from the light emitting layer EML may be emitted upward to the display device 1 (e.g., toward an upper surface to the display device 1), for example, in the third direction DR3, through the common electrode CME.

The sub-pixel electrode PXSE may be disposed on a surface (e.g., upper surface) of the insulating film 120. The sub-pixel electrode PXSE may be disposed for each of the first to third light emitting areas LA1, LA2, and LA3 defined by a pixel defining layer PDL to be described in more detail later. The sub-pixel electrode PXSE may be electrically coupled (e.g., electrically connected) to the switching element T by a contact hole penetrating (e.g., formed to penetrate) the insulating film 120.

The sub-pixel electrode PXSE may be a first electrode of the light emitting element EL, for example, an anode electrode. The sub-pixel electrode PXSE may have a laminated structure in which a high-work-function material layer including (e.g., being) Indium-Tin-Oxide (ITO), Indium-Zinc-Oxide (IZO), Zinc Oxide (ZnO), Indium Oxide ($In_2O_3$) and a reflective material layer including (e.g., being) silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof are laminated. The high-work-function material layer may be disposed above the reflective material layer to be disposed closer to the light emitting layer EML. The sub-pixel electrode PXSE may have a multi-layer structure of ITO/Mg, ITO/MgF, ITO/Ag, and ITO/Ag/ITO, but the present disclosure is not limited thereto.

The pixel defining layer PDL may be disposed on a surface (e.g. upper surface) of the insulating film 120 along the boundary of each sub-pixel PXS. The pixel defining layer PDL may be disposed on the sub-pixel electrode PXSE (e.g., on a side or edge of the sub-pixel electrode PXSE), and may include an opening exposing the sub-pixel electrode PXSE (e.g., a center portion of the sub-pixel electrode PXSE). The non-light emitting area NLA and the light emitting area LA may be divided by the pixel defining layer PDL and the opening thereof. For example, the non-light emitting area NLA may correspond to (e.g., overlap) the pixel defining layer PDL, and the light emitting area LA may correspond to (e.g., overlap) the opening of the pixel defining layer PDL. The pixel defining layer PDL may separate and insulate the sub-pixel electrodes PXSE of each of the plurality of light emitting elements EL.

The pixel defining layer PDL may include (e.g., be) an organic insulating material such as polyacrylate resin, epoxy resin, phenolic resin, polyamide resin, polyimide resin, unsaturated polyester resin, polyphenylene ether resin, polyphenylene sulfide resin, and/or benzocyclobutene (BCB). The pixel defining layer PDL may also include (e.g., be) an inorganic material.

The light emitting layer EML is disposed on the sub-pixel electrode PXSE exposed by the pixel defining layer PDL. In an embodiment in which the display device 1 is an organic light emitting display device, the light emitting layer EML may include an organic layer including (e.g., being) an organic material. The organic layer includes an organic light emitting layer, and in some cases, may further include a hole injection/transport layer and/or an electron injection/transport layer as an auxiliary layer to assist light emission. For example, the organic layer may include an organic light emitting layer and may further include a hole injection layer, a hole transport layer, an electron injection layer, and/or an electron transport layer. In another embodiment, when the display device is a micro LED display device, a nano LED display device, or the like, the light emitting layer EML may include (e.g., be) an inorganic material such as an inorganic semiconductor.

In some embodiments, the light emitting layer EML may have a tandem structure including a plurality of organic light emitting layers overlapping each other in the thickness direction and a charge generating layer disposed therebetween. For example, a charge generating layer may be between each of adjacent organic light emitting layers of the plurality of organic light emitting layers. The organic light emitting layers overlapping each other may emit light of the same wavelength, but may also emit light of different wavelengths. At least some of the light emitting layers EML of each sub-pixel may be separated from those of the neighboring (e.g., adjacent) sub-pixel PXS.

In an embodiment, the wavelength of light emitted by each light emitting layer EML may be the same for each sub-pixel PXS. For example, the light emitting layer EML of each sub-pixel PXS may emit blue light, and the color control structure of the color conversion substrate 30 may include the wavelength conversion layer WCL and the light transmission pattern TPL, to thereby display a color for each sub-pixel PXS.

In another embodiment, the wavelength of light emitted by each light emitting layer EML may be different in light emission wavelength band for each sub-pixel PXS. For example, the light emitting layer EML of the first sub-pixel PXS1 may emit light of a first color, and the light emitting layer EML of the second sub-pixel PXS2 may emit light of a second color, and the light emitting layer EML of the third sub-pixel PXS3 may emit light of a third color.

The common electrode CME may be disposed on the light emitting layer EML. The common electrode CME may not only contact the light emitting layer EML, but may also contact the upper surface of the pixel defining layer PDL in the non-light emitting area NLA.

The common electrode CME may be coupled (e.g., connected) without discrimination of the sub-pixel PXS. For example, the common electrode CME may be commonly coupled to multiple (e.g., some or all) of the sub-pixels PXS. The common electrode CME may be an entirely-disposed electrode without discrimination of the sub-pixel PXS. The common electrode CME may be a second electrode of the light emitting element EL, for example, a cathode electrode.

The common electrode CME may include a low-work-function material layer including (e.g., being) lithium (Li), calcium (Ca), LiF/Ca, LiF/Al, aluminum (Al), magnesium (Mg), silver (Ag), platinum (Pt), palladium (Pd), nickel (Ni), gold (Au) neodymium (Nd), iridium (Ir), chromium (Cr), BaF, barium (Ba), a compound thereof, or a mixture thereof (for example, a mixture of Ag and Mg). The common electrode CME may further include a transparent metal oxide layer disposed on the low-work-function material layer.

The thin film encapsulation structure 130 may be disposed on the common electrode CME. The thin film encapsulation structure 130 may prevent or block oxygen and/or moisture from permeating into the light emitting element EL.

The thin film encapsulation structure 130 may include at least one thin film encapsulation layer. For example, the thin film encapsulation layer may include a first inorganic film 131, an organic film 132, and a second inorganic film 133. Each of the first inorganic film 131 and the second inorganic film 133 may include (e.g., be) silicon nitride, silicon oxide, and/or silicon oxynitride. The organic film 132 may include (e.g., be) an organic insulating material such as polyacrylate resin, epoxy resin, phenolic resin, polyamide resin, polyimide resin, unsaturated polyester resin, polyphenylene ether resin, polyphenylene sulfide resin, and/or benzocyclobutene (BCB).

As described above, the color conversion substrate 30 may include first to third light transmitting areas TA1, TA2, and TA3 and first to third light blocking areas BA1, BA2, and BA3. The first to third light transmitting areas TA1, TA2, and TA3 of the color conversion substrate 30 may correspond to the first to third light emitting areas LA1, LA2, and LA3 of the display substrate 10, respectively. The first to third light blocking areas BA1, BA2, and BA3 may prevent or block the color mixing of light emitted from the first to third light transmitting areas TA1, TA2, and TA3.

The color conversion substrate 30 may include a second substrate 310, a color filter layer CFL, a light blocking member VAB, a first capping layer 320, a partition wall PTL, a wavelength conversion layer WCL, and a light transmission pattern TPL, and a second capping layer 330.

The color conversion substrate 30 may be disposed on the thin film encapsulation structure 130 to face the thin film encapsulation structure 130. For example, the color conversion substrate 30 and the thin film encapsulation structure 130 may partially or entirely overlap each other. The second substrate 310 of the color conversion substrate 30 may include (e.g., be) a transparent material. For example, the second substrate 310 may include (e.g., be) a transparent insulating material such as glass and/or quartz. The first substrate 110 may be a suitably rigid substrate. However, the second substrate 310 is not limited to that illustrated above. The second substrate 310 may include (e.g., be) plastic such as polyimide (PI), and may have suitably flexible characteristics capable of warping, bending, folding and/or rolling.

The second substrate 310 may be the same substrate as the first substrate 110, but may be different from the first substrate 110 in material, thickness, transmittance, and the like. For example, the second substrate 310 may have higher transmittance than the first substrate 110. Because the second substrate 310 includes (e.g., is) a light-transmitting material, light emitted from the first to third light transmitting areas TA1, TA2, and TA3 may be transmitted to be provided to the outside of the display device 1. The second substrate 310 may be thicker or thinner than the first substrate 110.

A buffer layer may be further disposed on a surface (e.g., lower surface) of the second substrate 310 facing the first substrate 110. The buffer layer may prevent or block impurities from flowing into a surface of the second substrate 310.

The color filter layer CFL may be disposed on a surface (e.g., lower surface) of the second substrate 310 facing the first substrate 110.

The color filter layer CFL may include a first color filter CF1, a second color filter CF2, and a third color filter CF3. Each of the color filters CF1, CF2, and CF3 may include (e.g., be) a colorant such as a dye and/or pigment that absorbs wavelengths other than the corresponding color wavelengths.

The first color filter CF1 may be disposed in the first light transmitting area TA1 of the first sub-pixel PXS1. The first color filter CF1 may also be disposed in the first to third light blocking areas BA1, BA2, and BA3. In an example embodiment, the first color filter CF1 disposed in the first light transmitting area TA1 and the first color filter CF1 disposed in the first to third light blocking areas BA1, BA2, and BA3 may be formed by the same process (e.g., may be formed from the same material or from the same layer). The first color filter CF1 disposed in the first light transmitting area TA1 may be formed to extend toward the first light blocking area BA1 and the third light blocking area BA3 adjacent to the first light transmitting area TA1 to be integrated with each other.

The first color filter CF1 may be a blue color filter. The first color filter CF1 may selectively transmit light of a first color (for example, blue light), and may block and/or absorb light of a second color (for example, green light) and light of a third color (for example, red light). For example, the first color filter CF1 may include (e.g., be) a blue colorant. The blue colorant may include (e.g., be) a blue dye and/or a blue pigment.

When the first color filter CF1 includes (e.g., is) a blue colorant, external light or reflected light transmitted through the first color filter CF1 may have a blue wavelength band. The eye color sensitivity perceived by a user's eyes may vary according to the color of light. For example, light in the blue wavelength band may be perceived to be less sensitive to the user's eyes than light in the green wavelength band and light in the red wavelength band. Accordingly, the first color filter CF1 includes (e.g., is) a blue colorant, so that the user may perceive the reflected light with less sensitivity.

The second color filter CF2 may be disposed in the second light transmitting area TA2 of the second sub-pixel PXS2. The second color filter CF2 may be disposed in the second light transmitting area TA2, and may extend toward the first light blocking area BA1 and the second light blocking area BA2 adjacent to the second light transmitting area TA2 to be partially disposed on the light blocking member VAB disposed on the first color filter CF1.

The second color filter CF2 may be a green color filter. The second color filter CF2 may selectively transmit light of a second color (for example, green light), and may block and/or absorb light of a first color (for example, blue light) and light of a third color (for example, red light). For example, the second color filter CF2 may include (e.g., be) a green colorant. The green colorant may include (e.g., be) a green dye and/or a green pigment.

The third color filter CF3 may be disposed in the third light transmitting area TA3 of the third sub-pixel PXS3. The third color filter CF3 may be disposed in the third light transmitting area TA3, and may extend toward the second light blocking area BA2 and the third light blocking area BA3 adjacent to the third light transmitting area TA3 to be partially disposed on the light blocking member VAB disposed on the first color filter CF1.

The third color filter CF3 may be a red color filter. The third color filter CF3 may selectively transmit light of a third color (for example, red light), and may block and/or absorb light of a first color (for example, blue light) and light of a second color (for example, green light). For example, the third color filter CF3 may include (e.g., be) a red colorant. The red colorant may include (e.g., be) a red dye and/or a red pigment.

The first to third color filters CF1, CF2, and CF3 may absorb a part of light flowing from the outside of the display device 1 into the color conversion substrate 30 to reduce reflected light due to external light. Therefore, the first to third color filters CF1, CF2, and CF3 may serve to prevent or reduce color distortion due to the reflection of external light.

The light blocking member VAB may be disposed on a surface (e.g., lower surface) of the first color filter CF1 facing the first substrate 110 along the boundary of the sub-pixel PXS. The light blocking member VAB is disposed in the first to third light blocking areas BA1, BA2, and BA3 to block light transmission. The light blocking member VAB may be disposed to surround the first to third light transmitting areas TA1, TA2, and TA3, and may thus have a grid shape in a plan view.

The light blocking member VAB may include (e.g., be) an organic material. The light blocking member VAB may absorb external light to reduce color distortion due to the reflection of external light. Further, the light blocking member VAB may prevent or block light from invading and/or mixing between the light transmitting areas TA1, TA2, and TA3 disposed adjacent to each other, thereby improving the color reproducibility of the display device 1.

In an embodiment, the light blocking member VAB may absorb light of all visible wavelengths. The light blocking member VAB may include (e.g., be) a light absorbing material. For example, the light blocking member VAB may be made of a material utilized as a black matrix of the display device 1. In another embodiment, the light blocking member VAB may absorb light of a set wavelength or wavelength range from among visible wavelengths and transmit light of another set wavelength or wavelength range.

The light blocking member VAB may be omitted.

The first capping layer 320 may be disposed on the color filter layer CFL. For example, in the first to third light transmitting areas TA1, TA2, and TA3, the first capping layer 320 may be in direct contact with a surface (for example, lower surface in FIG. 5) of each of the first to third color filters CF1, CF2, and CF3 disposed in the first to third light transmitting areas TA1, TA2, and TA3, and in the first to third light blocking areas BA1, BA2, and BA3. The first capping layer 320 may be in direct contact with the light blocking member VAB disposed in the first to third light blocking areas BA1, BA2, and BA3. For example, the first capping layer 320 may cover the lower surface of the first to third color filters CF1, CF2, and CF3 and of the light blocking member VAB.

The first capping layer 320 may prevent or block impurities such as moisture and/or air from permeating from the outside to damage and/or contaminate the color filter layer CFL and/or the wavelength conversion layer WCL. Further, the first capping layer 320 may prevent or block the colorant included in the color filter layer CFL from diffusing into the wavelength conversion layer WCL and/or the light transmission pattern TPL, which will be described in more detail later.

The first capping layer 320 may be made of an inorganic material. For example, the first capping layer 320 may include (e.g., be) at least one selected from among silicon nitride, aluminum nitride, zirconium nitride, titanium nitride, hafnium nitride, tantalum nitride, silicon oxide, aluminum oxide, titanium oxide, tin oxide, and silicon oxynitride.

The partition wall PTL may be disposed on the first capping layer 320. The partition wall PTL may be located in the first to third light blocking areas BA1, BA2, and BA3, and may overlap the non-light emitting area NLA. The partition wall PTL may be disposed to overlap the light blocking member VAB. The partition wall PTL may be disposed to surround the first to third light transmitting areas TA1, TA2, and TA3. The partition wall PTL may include an opening exposing the color filter layer CFL and the light transmission pattern TPL.

Color control layers WCL and TPL may be disposed in a space exposed by the opening of the partition wall PTL. In an embodiment, the color control layers WCL and TPL may be formed by an inkjet process utilizing the partition wall PTL as a bank. The partition wall PTL may serve as a guide for stably placing an ink composition for forming the color control layers WCL and TPL at a set or predetermined position. The partition wall PTL may include (e.g., be) a photosensitive organic material, but the material thereof is not limited thereto. The partition wall PTL may further include (e.g., be) a light blocking material.

The color control layers WCL and TPL may include a wavelength conversion layer WCL to convert the wavelength of incident light and a light transmission pattern TPL to maintain and to pass the wavelength of incident light. The wavelength conversion layer WCL and/or the light transmission pattern TPL may be disposed to be separated for each sub-pixel PXS. The wavelength conversion layer WCL and/or the light transmission pattern TPL may overlap the light emitting area LA and the light transmitting area TA in the thickness direction. The wavelength conversion layer WCL and/or the light transmission pattern TPL disposed adjacent to each other may be spaced apart from each other by the partition wall PTL disposed in the light blocking area BA.

The wavelength conversion layer WCL and the light transmission pattern TPL may be disposed on the first capping layer 320. In some embodiments, as described above, the wavelength conversion layer WCL and the light transmission pattern TPL may be formed by an inkjet method. However, the present disclosure is not limited thereto. For example, each of the wavelength conversion layer WCL and the light transmission pattern TPL may be formed by applying a photosensitive material and exposing and developing the applied photosensitive material to form a pattern. Hereinafter, a case where the wavelength conversion layer WCL and the light transmission pattern TPL are formed by an inkjet method will be described in more detail.

The wavelength conversion layer WCL may be disposed in the sub-pixel PXS in which the wavelength of light incident from the light emitting element EL is different from the color of the corresponding sub-pixel PXS and thus in which the wavelength needs to be converted. The light transmission pattern TPL may be disposed in the sub-pixel PXS in which the wavelength of light incident from the light-emitting element EL is the same as the color of the corresponding sub-pixel PXS. The exemplified embodiment is a case in which the light emitting layer EML of each sub-pixel PXS is to emit light of a first color. In this case, the light transmission pattern TPL is disposed in the first sub-pixel PXS1, and the wavelength conversion layer WCL is disposed in the second sub-pixel PXS2 and the third sub-pixel PXS3. As another example, when the light emitting element EL of each sub-pixel PXS is to emit light having a wavelength different from that of the color of each sub-pixel PXS, such as ultraviolet light, only the wavelength conversion layer WCL may be disposed in each sub-pixel PXS without the light transmission pattern TPL.

In an example embodiment, the wavelength conversion layer WCL may include a first wavelength conversion pattern WCL1 disposed in the second sub-pixel PXS2 and a second wavelength conversion pattern WCL2 disposed in the third sub-pixel PXS3.

The light transmission pattern TPL may be disposed in the first light transmitting area TA1 partitioned by the partition wall PTL in the first sub-pixel PXS1. The light transmission pattern TPL may overlap the first color filter CF1 disposed in the first light transmitting area TA1. The light transmission pattern TPL is to transmit light of the first color incident from the light emitting layer EML and to maintain the wavelength of the light of the first color. For example, the light transmission pattern TPL is to transmit blue light incident from the light emitting layer EML and to maintain the wavelength of the blue light.

The light transmission pattern TPL may include (e.g., be) a first base resin BRS1. The light transmission pattern TPL may further include (e.g., be) a first scatterer SCP1 dispersed in the first base resin BRS1.

The first wavelength conversion pattern WCL1 may be disposed in the second light transmitting area TA2 partitioned by the partition wall PTL in the second sub-pixel PXS2. The first wavelength conversion pattern WCL1 may overlap the second color filter CF2 disposed in the second light transmitting area TA2. The first wavelength conversion pattern WCL1 may convert light having a wavelength of a first color incident from the light emitting layer EML into light having a wavelength of a second color different from the first color and may emit the converted light. For example, the first wavelength conversion pattern WCL1 may convert blue light incident from the light emitting layer EML into green light and may emit the green light.

The first wavelength conversion pattern WCL1 may include (e.g., be) a second base resin BRS2 and a first wavelength conversion material WCP1 dispersed in the second base resin BRS2. The first wavelength conversion pattern WCL1 may further include (e.g., be) a second scatterer SCP2 dispersed in the second base resin BRS2.

The second wavelength conversion pattern WCL2 may be disposed in the third light transmitting area TA3 partitioned by the partition wall PTL in the third sub-pixel PXS3. The second wavelength conversion pattern WCL2 may overlap the third color filter CF3 disposed in the third light transmitting area TA3. The second wavelength conversion pattern WCL2 may convert light having a wavelength of a first color incident from the light emitting layer EML into light having a wavelength of a third color different from the first color and may emit the converted light. For example, the second wavelength conversion pattern WCL2 may convert blue light incident from the light emitting layer EML into red light and may emit the red light.

The second wavelength conversion pattern WCL2 may include (e.g., be) a third base resin BRS3 and a second wavelength conversion material WCP2 dispersed in the third base resin BRS3. The second wavelength conversion pattern WCL2 may further include (e.g., be) a third scatterer SCP3 dispersed in the third base resin BRS3.

The first to third base resins BRS1, BRS2, and BRS3 may include (e.g., be) a translucent organic material. For example, the first to third base resins BRS1, BRS2, and BRS3 may include (e.g., be) epoxy resin, acrylic resin, cardo resin, and/or imide resin. The first to third base resins BRS1, BRS2, and BRS3 may be made of the same material, but the present disclosure is not limited thereto.

The first to third scatterers SCP1, SCP2, and SCP3 may have different refractive indexes than the first to third base resins BRS1, BRS2, and BRS3, respectively. The first to third scatterers SCP1, SCP2, and SCP3 may be metal oxide particles and/or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$), and examples of the organic material may include acrylic resin and urethane resin. The first to third scatterers SCP1, SCP2, and SCP3 may be made of the same material, but the present disclosure is not limited thereto.

The first wavelength conversion material WCP1 may convert the first color into the second color, and the second wavelength conversion material WCP2 may convert the first color into the third color. For example, the first wavelength conversion material WCP1 may convert blue light into green light, and the second wavelength conversion material WCP2 may convert blue light into red light. The first wavelength conversion material WCP1 and the second wavelength conversion material WCP2 may be quantum dots, quantum rods, and/or phosphors. The quantum dots may include group IV nanocrystals, group II-VI compound nanocrystals, group III-V compound nanocrystals, group IV-VI nanocrystals, or combinations thereof.

The second capping layer 330 is disposed on the wavelength conversion layer WCL and the light transmission pattern TPL. The second capping layer 330 may be made of an inorganic material. The second capping layer 330 may include (e.g., be) a material selected from the materials listed as the material of the first capping layer 320. The second capping layer 330 and the first capping layer 320 may be made of the same material, but the present disclosure is not limited thereto.

The second capping layer 330 may cover each of the wavelength conversion pattern WCL1 and WCL2 and the light transmission pattern TPL. The second capping layer 330 may cover not only one surface (e.g., lower surface) but also side surfaces of each of the wavelength conversion patterns WCL1 and WCL2 and the light transmission pattern TPL. The second capping layer 330 may contact the partition wall PTL in a space between the neighboring color control layers WCL and TPL. The second capping layer 330 may have a conformal shape with respect to the surface step formed by the color control layers WCL and TPL.

The filling layer 70 may be disposed between the display substrate 10 and the color conversion substrate 30. The filling layer 70 may serve to fill a space between the display substrate 10 and the color conversion substrate 30 and may serve to couple the display substrate 10 and the color conversion substrate 30. The filling layer 70 may be disposed between the thin film encapsulation structure 130 of the display substrate 10 and the second capping layer 330 of the color conversion substrate 30. The filling layer 70 may be made of a silicon-based organic material, an epoxy-based organic material, or the like, but the material thereof is not limited thereto.

Figure 6:
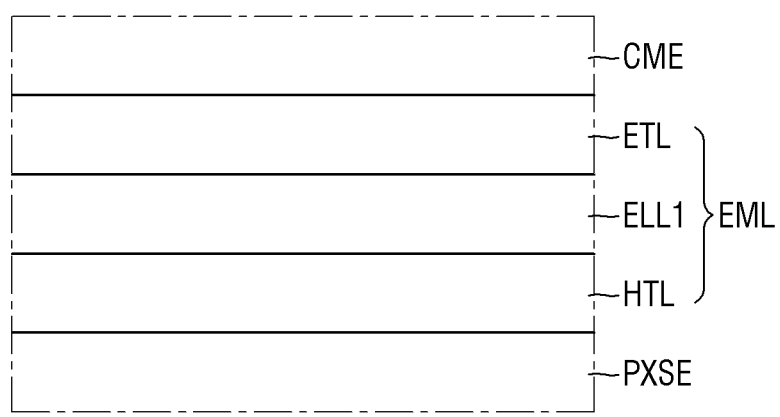
FIG. 6 is an enlarged cross-sectional view of the portion Q of FIG. 5.
Figure 7:
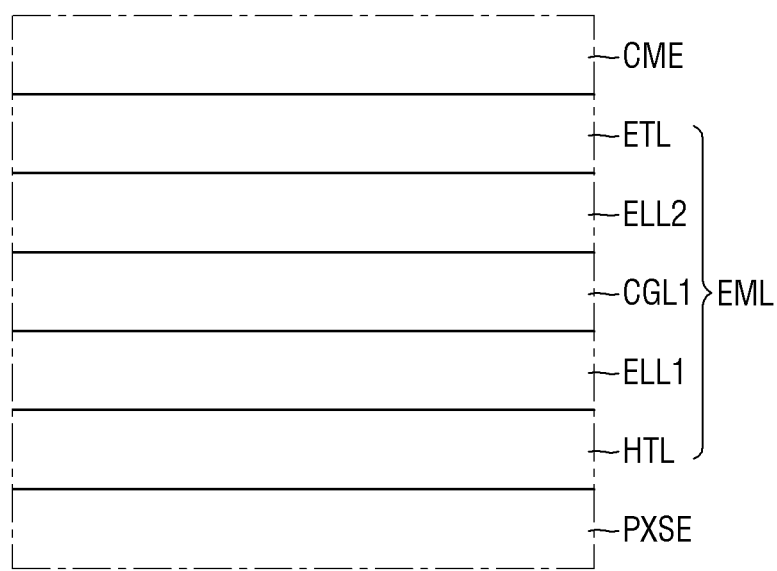
FIGS. 7 and 8 are cross-sectional views illustrating modified examples of the structure shown in FIG. 6.
Figure 8:
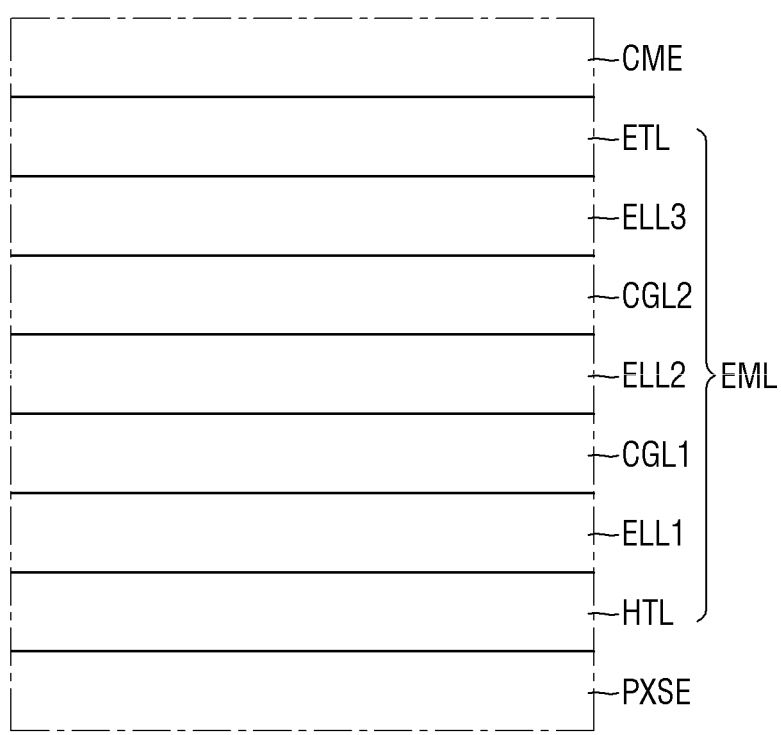

FIG. 6 is an enlarged cross-sectional view of the portion Q of FIG. 5, and FIGS. 7 and 8 are cross-sectional views illustrating modified examples of the structure shown in FIG. 6.

Referring to FIG. 6, in an embodiment, the light emitting layer EML may include a hole transport layer HTL disposed on the sub-pixel electrode PXSE, a first light emitting material layer ELL1 disposed on the hole transport layer HTL, and an electron transport layer ETL disposed on the first light emitting material layer ELL1. In the present embodiment, the light emitting layer EML includes only one light emitting material layer, for example, the first light emitting material layer ELL1 as the light emitting material layer, and the first light emitting material layer ELL1 may emit blue light. However, the laminated structure of the light emitting layer EML is not limited to the structure of FIG. 6, and may be modified, for example, as shown in FIGS. 7 and 8 to be described below.

Referring to FIG. 7, in another embodiment, the light emitting layer EML may include a first charge generating layer CGL1 disposed on the first light emitting material layer ELL1 and a second light emitting material layer ELL2 disposed on the first charge generating layer CGL1, and the electron transport layer ETL may be disposed on the second light emitting material layer ELL2.

The first charge generating layer CGL1 may serve to inject charge into the first and second light emitting material layers ELL1 and ELL2. The first charge generating layer CGL1 may serve to control charge balance between the first light emitting material layer ELL1 and the second light emitting material layer ELL2. In some embodiments, the first charge generating layer CGL1 may include an n-type (e.g., n-based) charge generating layer and a p-type (e.g., p-based) charge generating layer. The p-type charge generating layer may be disposed on the n-type charge generating layer.

The second light emitting material layer ELL2 may emit blue light as in the first light emitting material layer ELL1, but the second light emitting material layer ELL2 is not limited thereto. The second light emitting material layer ELL2 may emit blue light having the same peak wavelength as, or a different peak wavelength from, the light emitted from the first light emitting material layer ELL1. In another embodiment, the first light emitting material layer ELL1 and the second light emitting material layer ELL2 may emit light of different colors from each other. For example, the first light emitting material layer ELL1 may emit blue light, and the second light emitting material layer ELL2 may emit green light. The light emitting layer EML having the structure shown in FIG. 7 includes two light emitting material layers, so that the light emission efficiency and lifetime thereof may be improved as compared with those of the structure of FIG. 6.

Referring to FIG. 8, in another embodiment, it is illustrated that the light emitting layer EML may include three light emitting material layers ELL1, ELL2, and ELL3 and two charge generating layers CGL1 and CGL2 interposed therebetween. As shown in FIG. 8, the light emitting layer EML may include a first charge generating layer CGL1 disposed on the first light emitting material layer ELL1, a second light emitting material ELL2 disposed on the first charge generating layer CGL1, a second charge generating layer CGL2 disposed on the second light emitting material layer ELL2, and a third light emitting material layer ELL3 disposed on the second charge generating layer CGL2.

The third light emitting material layer ELL3 may emit blue light as in the first light emitting material layer ELL1 and the second light emitting material layer ELL2. In an example embodiment, each of the first light emitting material layer ELL1, the second light emitting material layer ELL2, and the third light emitting material layer ELL3 may emit blue light, but the light emitted from each of the light emitting material layers ELL1, ELL2, and ELL3 may all have the same wavelength peak, or some of the wavelength peaks may be different. In another embodiment, the colors of light emitted from the first light emitting material layer ELL1, the second light emitting material layer ELL2, and the third light emitting material layer ELL3 may be different from each other. For example, each light emitting material layer may emit blue light or green light, and each light emitting material layer may emit red light, green light, and blue light to emit white light as a whole. For example, in some embodiments, all three from among the first to third light emitting material layers ELL1, ELL2, and ELL3 are to emit blue light. In some embodiments, one or two from among the first to third light emitting material layers ELL1, ELL2, and ELL3 are to emit blue light and the remaining light emitting material layer(s) of the first to third light emitting material layers ELL1, ELL2, and ELL3 are to emit green light. In some embodiments, one from among the first to third light emitting material layers ELL1, ELL2, and ELL3 is to emit blue light, another one from among the first to third light emitting material layers ELL1, ELL2, and ELL3 is to emit green light, and the remaining one from among the first to third light emitting material layers ELL1, ELL2, and ELL3 is to emit red light.

FIGS. 9 to 12 are cross-sectional views illustrating a method of repairing a display device according to an embodiment.

Figure 9:
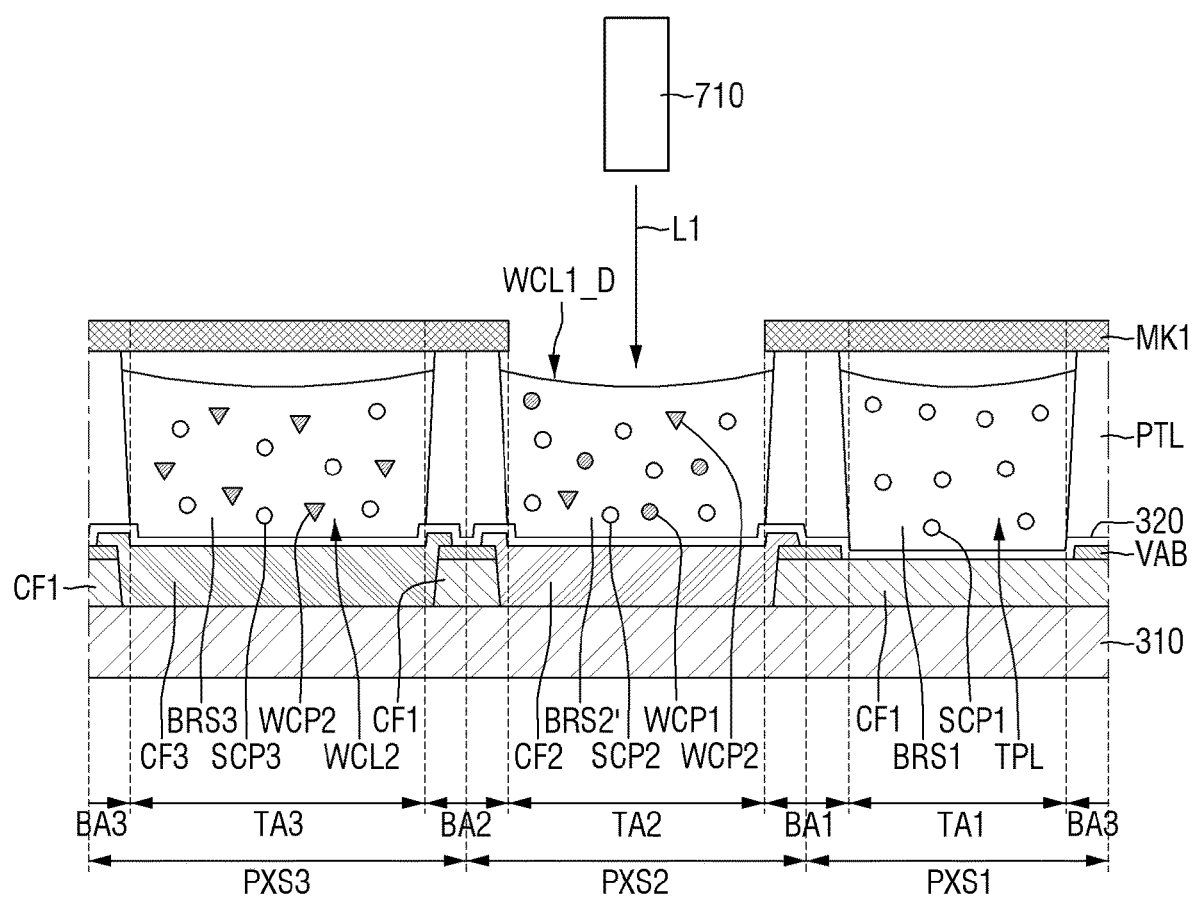
FIGS. 9 to 12 are cross-sectional views illustrating an example of a process of repairing a display device according to an embodiment.

The display device 1 of FIG. 5 may be manufactured before performing the repair process of FIG. 9. Thereafter, an inspection process is performed to determine the presence or absence of a defective sub-pixel, for example, a sub-pixel having a defect in the wavelength conversion pattern. The inspection process may be performed by, for example, a method of grasping (e.g., detecting) the presence and location of dark spots for each sub-pixel by implementing a test pattern by bonding the display substrate 10 and the color conversion substrate 30. Hereinafter, in an embodiment of the present disclosure, a case where a defect occurs in the wavelength conversion pattern disposed in the second light transmitting area TA2 of the second sub-pixel PXS2 to display the second color, for example, green will be described as an example.

Referring to FIG. 9, in an embodiment of the present disclosure, a first wavelength conversion pattern in which a defect has occurred (hereinafter, a defective wavelength conversion pattern WCL1_D or a mixed wavelength conversion pattern WCL1_D) may be formed in the second light emitting area TA2 of the second sub-pixel PXS2. The defective wavelength conversion pattern WCL1_D shown in FIG. 9 may be generated due to an equipment operation defect such as ink mis-injection or an ink overflow, or due to a material defect during an inkjet process forming the wavelength conversion layer WCL.

For example, the defective wavelength conversion pattern WCL1_D may include (e.g., be) a fourth base resin BRS2' in which the second base resin BRS2 and the third base resin BRS3 are mixed, a second scatterer SCP2 dispersed in the fourth base resin BRS2', a first wavelength conversion material WCP1, and a second wavelength conversion material WCP2. For example, the defective wavelength conversion pattern WCL1_D, which may be a wavelength conversion layer formed by mixing a material included in the first wavelength conversion pattern WCL1 disposed in the second sub-pixel PXS2 with a material included in the second wavelength conversion pattern WCL2 disposed in the third sub-pixel PXS3, may be a defective wavelength conversion layer that causes dark spots in the display device 1.

Hereinafter, a method of repairing a display device according to an embodiment of the present disclosure will be described in more detail.

Referring to FIGS. 9 to 12, a method of repairing a display device according to an embodiment includes the tasks of: removing a defective wavelength conversion pattern (or a mixed wavelength conversion pattern); and forming a repair pattern in a groove formed by removing the defective wavelength conversion pattern. The task of forming the repair pattern may include a task of injecting ink including (e.g., being) a wavelength conversion material into the groove formed by removing the defective wavelength conversion pattern to form a repair material layer, and a task of curing the repair material layer to form a repair pattern. The method of repairing a display device may further include a task of inspecting the thickness of the repair pattern. Hereinafter, each repair process will be described in more detail with reference to FIGS. 9 to 12.

First, referring to FIG. 9, the defective wavelength conversion pattern formed in the second sub-pixel (or defective pixel) is removed.

For example, the defective wavelength conversion pattern WCL1_D may be removed by irradiating the defective wavelength conversion pattern WCL1_D with a laser beam L1. The laser beam L1 may be applied utilizing a laser unit 710. For example, the laser unit 710 may include at least one of a nano laser or a femtosecond laser. In some embodiments, the laser unit 710 may include a nanosecond laser.

The laser unit 710 may irradiate the defective wavelength conversion pattern WCL1_D disposed in the second transmitting area TA2 with the laser beam L1 to remove the defective wavelength conversion pattern WCL1_D. The defective wavelength conversion pattern WCL1_D disposed in the space partitioned by the partition wall PTL disposed in the first light blocking area BA1 and the second light blocking area BA2 may be at least partially removed by the laser beam L1.

Before the irradiation of the laser beam L1, a first mask MK1 may be aligned between the laser unit 710 and the color conversion substrate 30. The first mask MK1 may include a pattern plate including a transmission portion (e.g., an opening in the first mask MK1) that is to transmit the laser beam L1 emitted from the laser unit 710 and a blocking portion that is to block the laser beam L1.

The first mask MK1 may be disposed such that the transmission portion of the first mask MK1 is aligned with an area corresponding to the second light transmitting area TA2 of the second sub-pixel PXS2. For example, the transmission portion of the first mask MK1 may be an opening in the first mask MK1 that overlaps the second light transmitting area TA2. Accordingly, when the laser unit 710 irradiates the defective wavelength conversion pattern WCL1_D with the laser beam L1, the first mask MK1 may serve to prevent, or reduce the occurrence of, a member or component of the color conversion substrate 30 disposed in an area other than the second light transmitting area TA2 of the second sub-pixel PXS2 where a defect occurs from being damaged or removed by the laser beam L1.

The focus of the laser beam L1 may be controlled or adjusted such that the laser beam L1 irradiated from the laser unit 710 selectively removes (e.g., is set or configured to remove) the defective wavelength conversion pattern WCL1_D without removing the second color filter CF2.

Figure 10:
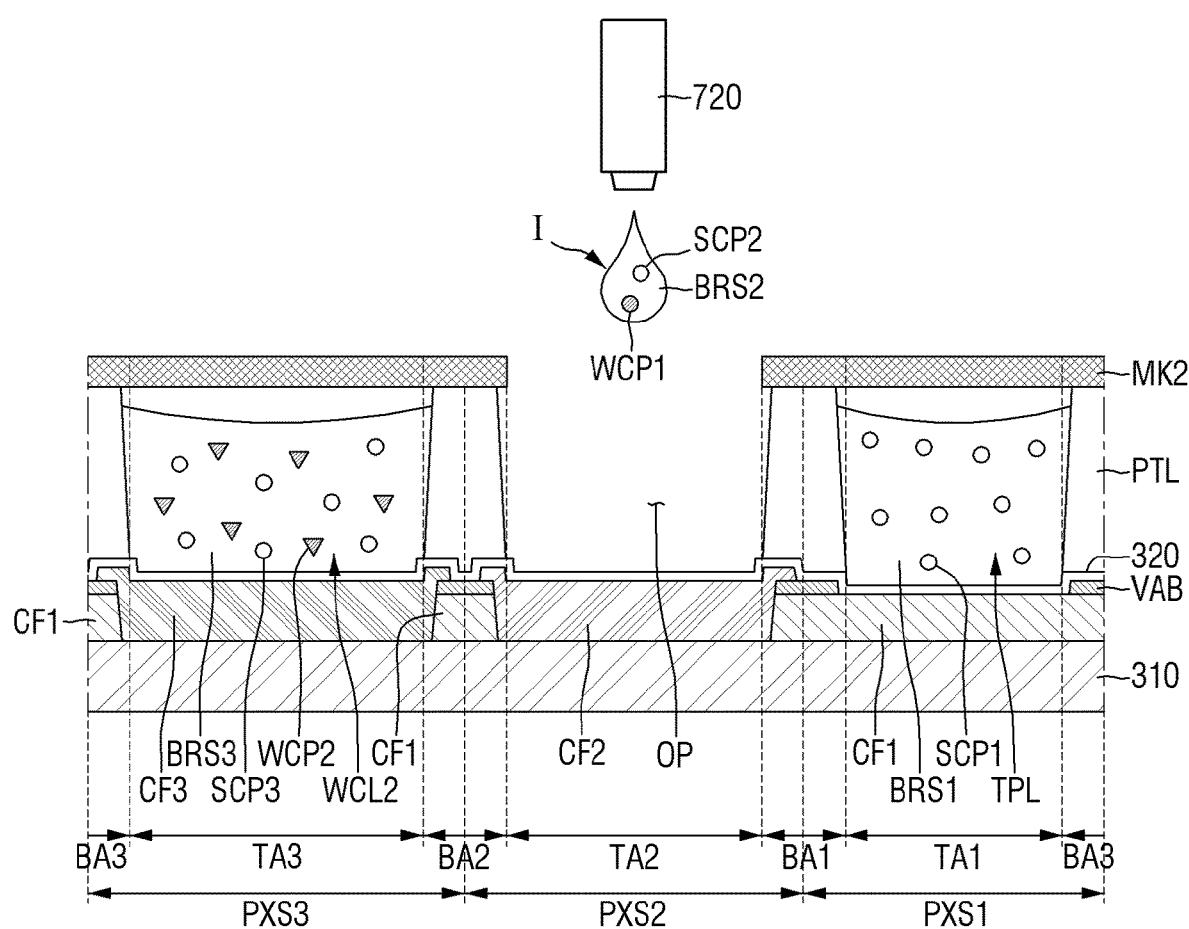

As shown in FIG. 10, the defective wavelength conversion pattern WCL1_D may be removed from the second light transmitting area TA2 to form a groove OP. The groove OP may overlap the second light transmitting area TA2 of the second sub-pixel PXS2 where a defect has occurred. The groove OP may be a space partitioned by the partition wall PTL disposed in the first light blocking area BA1 and the second light blocking area BA2. For example, the groove OP may be a volume that was occupied by the portion of the defective wavelength conversion pattern WCL1_D that was removed by the laser unit 710 utilizing the laser beam L1.

Subsequently, referring to FIG. 10, a repair material layer is formed in the groove OP formed by removing the defective wavelength conversion pattern.

For example, a repair material layer WCL1_R (refer to FIG. 11) may be formed by an inkjet method in the groove OP formed by removing the defective wavelength conversion pattern WCL1_D. An inkjet nozzle 720 injects ink I into a space partitioned by the partition wall PTL disposed in the first light blocking area BA1 and the second light blocking area BA2. The second color filter CF2 is located on the bottom surface of the space partitioned by the partition wall PTL. For example, the second color filter CF2 may be located on the bottom surface of the first capping layer 320 such that the first capping layer 320 separates the second color filter CF2 from the ink I disposed in the groove OP. The ink I may include (e.g., be) a first wavelength conversion material WCP1 or a second wavelength conversion material WCP2 that converts (e.g., that respectively converts) light of a first color into light of a second color or light of a third color. The wavelength conversion material included in the ink I may be a wavelength conversion material that converts light of a set or predetermined color into light of a color represented by a sub-pixel PXS in which a repair process is performed, for example, a sub-pixel PXS in which a defect occurs.

For example, when the defective sub-pixel is the second sub-pixel PXS2, the ink I may include (e.g., be) the first wavelength conversion material WCP1. The ink I may include (e.g., be) the same material as the material included in the first wavelength conversion pattern WCL1 of FIG. 5. For example, the ink I may include (e.g., be) a solvent containing the same material as the second base resin BRS2, and a second scatterer SCP2 and a first wavelength conversion material WCP1 which are dispersed in the solvent. The injection amount of the ink I may be determined in consideration of the surface tension of the ink I and the shrinkage of volume after drying the ink I.

Figure 11:
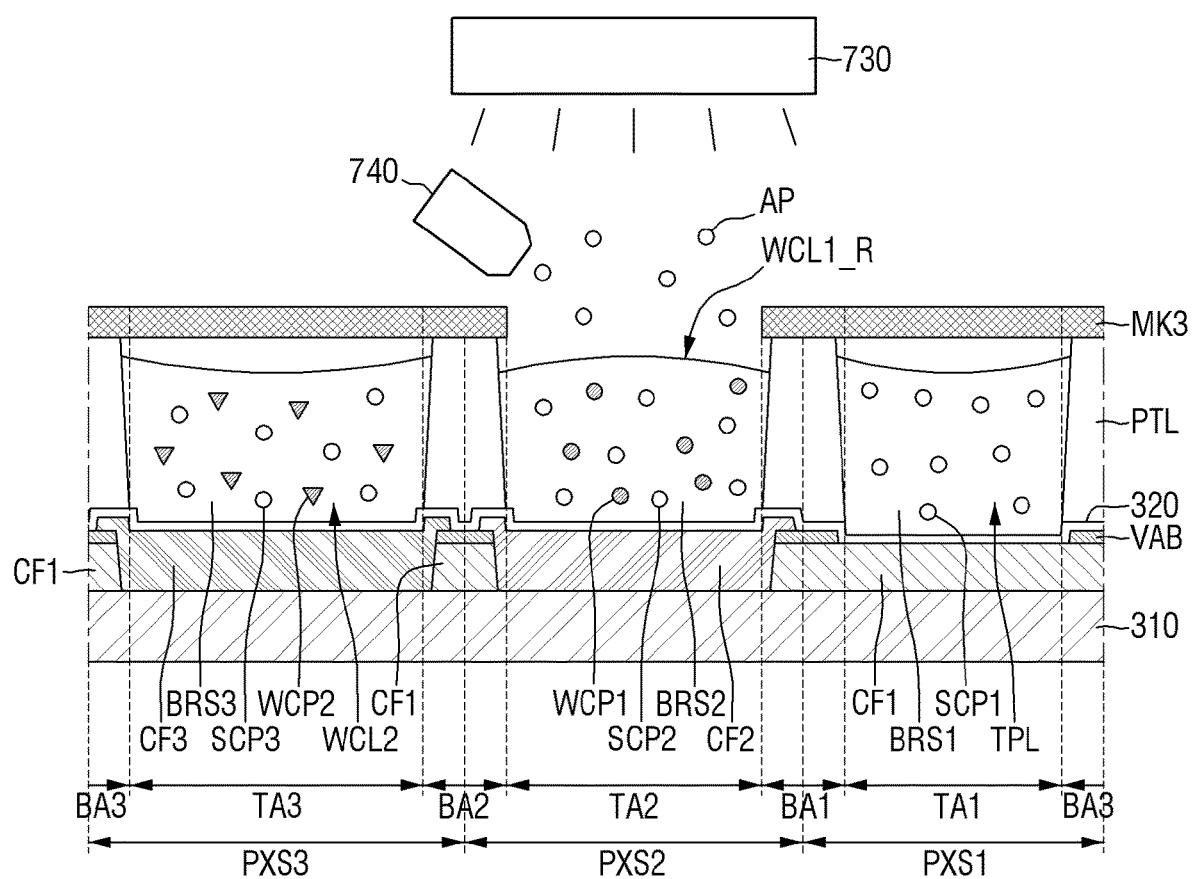

The ink I may be injected into the groove OP to form the repair material layer WCL1_R of FIG. 11 filling the space partitioned by the partition wall PTL. The repair material layer WCL1_R may be controlled or adjusted so as not to overflow over the partition wall PTL toward the adjacent sub-pixel area(s).

Before injecting the ink I utilizing the inkjet nozzle 720, a second mask MK2 may be aligned between the inkjet nozzle 720 and the color conversion substrate 30. The second mask MK2 may include an opening in an area corresponding to the second light transmitting area TA2 of the second sub-pixel PXS2. When the ink I is injected onto the second substrate 310 utilizing the inkjet nozzle 720, the second mask MK2 may serve to prevent or block the ink I containing the first wavelength conversion material WCP1 from being injected into an area other than the second light transmitting area TA2 of the second sub-pixel PXS2 where a defect has occurred. In some embodiments, the ink I may be injected onto the first capping layer 320 by utilizing the inkjet nozzle 720, and the second mask MK2 may serve the function described above. However, the present disclosure is not limited thereto. For example, the second mask MK2 may be omitted.

The inkjet nozzle 720 may be coupled to (e.g., connected to) an ink supply apparatus to receive the ink I from the ink supply apparatus. The ink supply apparatus may include an ink storage unit in which the ink I is stored and a circulation pump for circulating the ink I. Because the circulation pump circulates the ink I, the circulation pump may serve to prevent or reduce a phenomenon that the ink I hardens (e.g., coagulates or clumps) and to maintain the viscosity of the ink I, thereby improving the quality and/or reliability of the repair process of the display device 1.

Subsequently, referring to FIG. 11, the repair material layer is cured to form a repair pattern.

A repair pattern WCL1' (refer to FIG. 12) may be formed by curing the repair material layer WCL1_R. For example, the repair material layer WCL1_R may be cured by radiating light on (e.g., onto) the repair material layer WCL1_R utilizing a light irradiation device 730. The light irradiation device 730 is not limited as long as it can cure the repair material layer WCL1_R. For example, the light irradiation device 730 may be any device that is suitable to cure the repair material layer WCL1_R. For example, the light irradiation device 730 may include a UV lamp.

In an example embodiment, in the process of curing the repair material layer WCL1_R. the repair material layer WCL1_R may be cured by radiating light on the repair material layer WCL1_R utilizing the light irradiation device 730 in a state in which a gas atmosphere is created while introducing gas AP onto the repair material layer WCL1_R utilizing a gas injector 740. For example, the repair material layer WCL1_R may be cured by radiating light onto the repair material layer WCL1_R while creating a gas atmosphere including (e.g., being) the gas AP at (e.g., on, near, or around) the repair material layer WCL1_R. The gas AP may include (e.g., be) nitrogen ($N_2$) or any suitable gas. The gas AP may be locally injected only onto the repair material layer WCL1_R so as not to affect the absence of the color conversion substrate 30 formed in the adjacent sub-pixel PXS. For example, a gas atmosphere including the gas AP may be created so that it is substantially only at (e.g., on, near, or around) the repair material layer WCL1_R. However, the present disclosure is not limited thereto. For example, the entire display device may be in the gas atmosphere including the gas AP.

Before radiating light on the repair material layer WCL1_R utilizing the light irradiation device 730 and creating a gas (AP) atmosphere, a third mask MK3 may be aligned between the light irradiation device 730 and the gas injector 740 and the color conversion substrate 30. The third mask MK3 may include an opening in an area corresponding to the second light transmitting area TA2 of the second sub-pixel PXS2. The third mask MK3 may serve to prevent, or reduce the occurrence of, a member or component of the color conversion substrate 30 disposed in an area other than the second light transmitting area TA2 of the second sub-pixel PXS2 where a defect occurs from being damaged by the light emitted from the light irradiation device 730.

Figure 12:
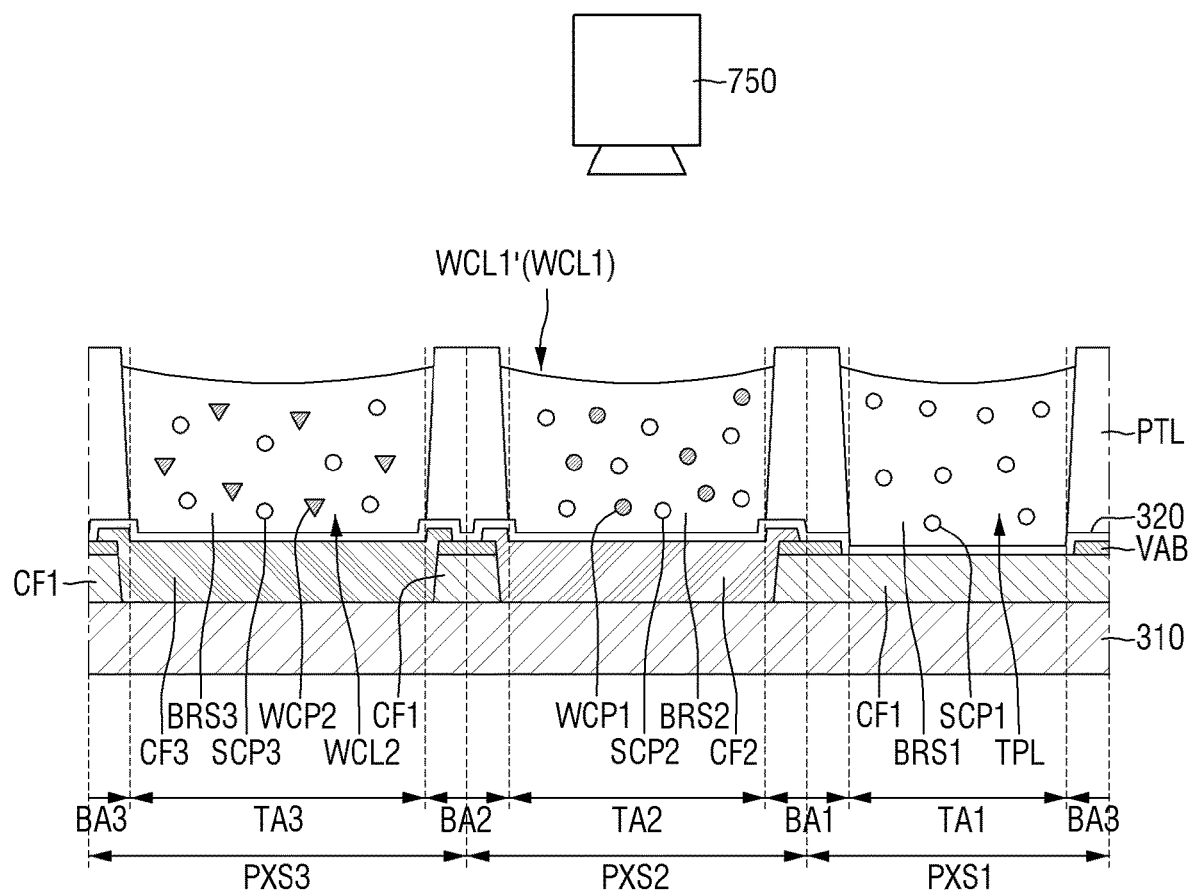

Subsequently, referring to FIG. 12, the repair pattern is inspected.

For example, the thickness of the repair pattern WCL1' formed in the second light transmitting area TA2 of the second sub-pixel PXS2 may be inspected utilizing a camera unit 750. The camera unit 750 may measure the thickness of the repair pattern WCL1' by photographing the repair pattern WCL1' from the upper portion of the area where the repair process is performed. For example, the camera unit 750 may be positioned above the repair pattern WCL1' such that it may photograph the repair pattern WCL1' in a planar view. When the thickness is at a reference set value or less, the inkjet process of FIG. 10 may be performed again. The quality and/or reliability of the repair process may be improved by performing a process of inspecting the thickness of the repair pattern WCL1', FIG. 13 is a cross-sectional view illustrating another example of the process of repairing a display device.

Figure 13:
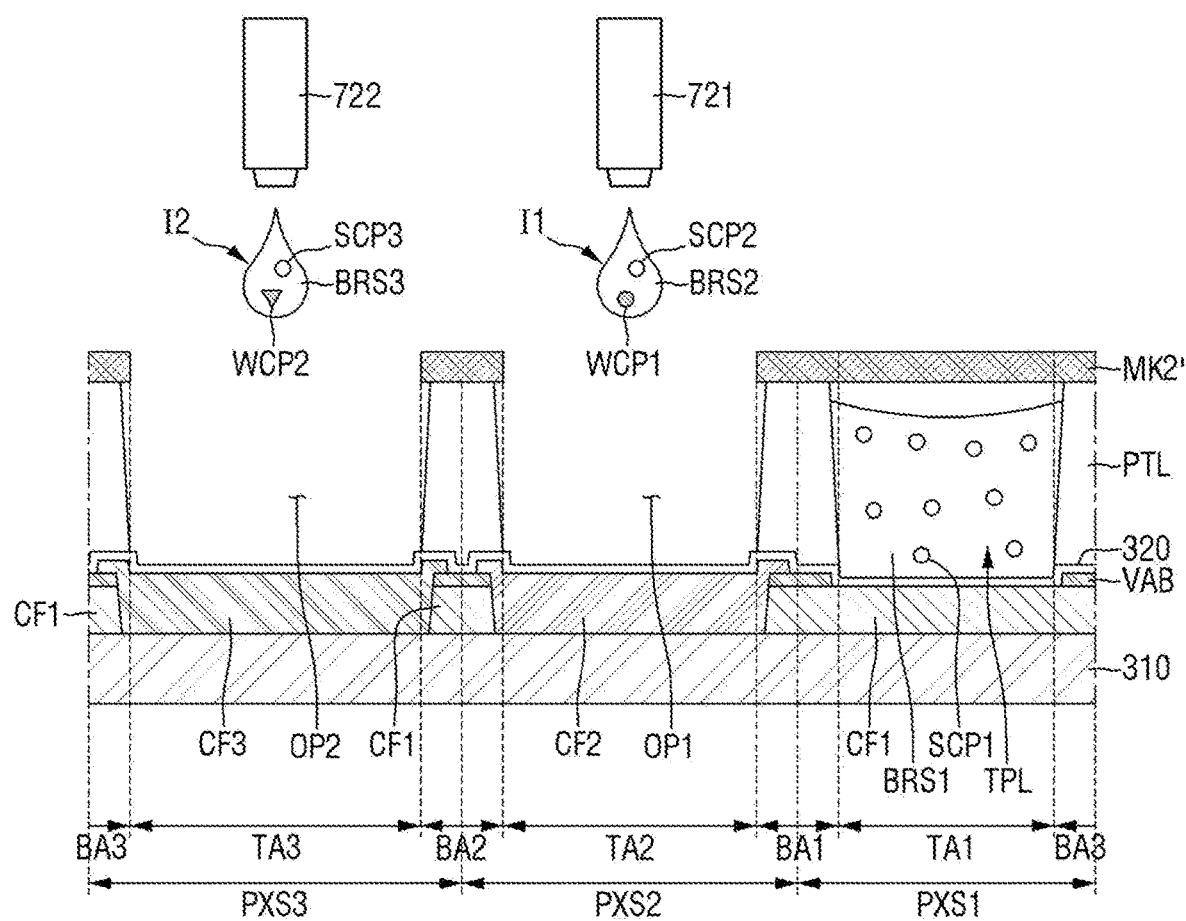
FIG. 13 is a cross-sectional view illustrating another example of the process of repairing a display device.

Referring to FIG. 13, the embodiment of FIG. 13 is different from the embodiment of FIG. 10 in that ink 11 containing the first wavelength conversion material WCP1 and ink 12 containing the second wavelength conversion material WCP2 are injected onto the second sub-pixel PXS2 and the third sub-pixel PXS3, respectively, to concurrently or simultaneously repair adjacent sub-pixels included in the pixel where a defect has occurred.

For example, grooves OP1 and OP2 formed by removing the defective wavelength conversion pattern (e.g., by respectively removing defective wavelength conversion patterns of the second sub-pixel PXS2 and the third sub-pixel PXS3) may overlap the second light transmitting area TA2 of the second sub-pixel PXS2 and the third light transmitting area TA3 of the third sub-pixel PXS3. The grooves OP1 and OP2 formed by removing the defective wavelength conversion pattern may include a first groove OP1 overlapping the second light transmitting area TA2 and a second groove OP2 overlapping the third light transmitting area TA3.

Inkjet nozzles 721 and 722 may include a first inkjet nozzle 721 to inject ink into the first groove OP1 and a second inkjet nozzle 722 to inject ink into the second groove OP2. The first inkjet nozzle 721 and the second inkjet nozzle 722 may be disposed to be controlled or adjusted according to an interval between adjacent sub-pixels PXS. For example, the height or each of the first and second inject nozzles 721 and 722 may be controlled or adjusted based on a horizontal distance by which adjacent sub-pixels PXS are separated.

The first inkjet nozzle 721 may inject the first ink 11 into the first groove OP1. The first ink 11 may include (e.g., be) substantially the same material as the ink of FIG. 10 (refer to FIG. 10).

The second inkjet nozzle 722 may inject the second ink 12 into the second groove OP2. The second ink 12 may include (e.g., be) a solvent including (e.g., being) the same material as the third base resin BRS3, and a third scatterer SCP3 and a second wavelength conversion material WCP2 which are dispersed in the solvent.

A second mask MK2' may be aligned between the first inkjet nozzle 721 and the second inkjet nozzle 722 and the color conversion substrate 30. The second mask MK2' may include a plurality of transmission portions (e.g., openings) and a plurality of blocking portions. The second mask MK2' may be disposed such that the plurality of transmission portions are disposed in areas corresponding to the second and third light transmitting areas TA2 and TA3.

The second mask MK2' may be omitted.

Hereinafter, cross-sectional views of the display device having undergone the repair process as shown in FIGS. 9 to 12 will be described. In the following embodiments, descriptions of the same components as those of the embodiment already described may be simplified or may not be repeated, and differences will be mainly described. Although the following drawings show only a pixel including sub-pixels having undergone a repair process due to the occurrence of defects, for example, the formation of a defective wavelength conversion pattern (or mixed wavelength conversion pattern), another pixel in which a defect of a display device has not occurred may also include the structure shown in FIG. 5. For example, a display device according to the present disclosure may have the repair process shown in FIGS. 9 to 12 applied to a subset of pixels from among a plurality of pixels of the display device, and the repair process may not be applied to the remaining pixels of the plurality of pixels.

Figure 14:
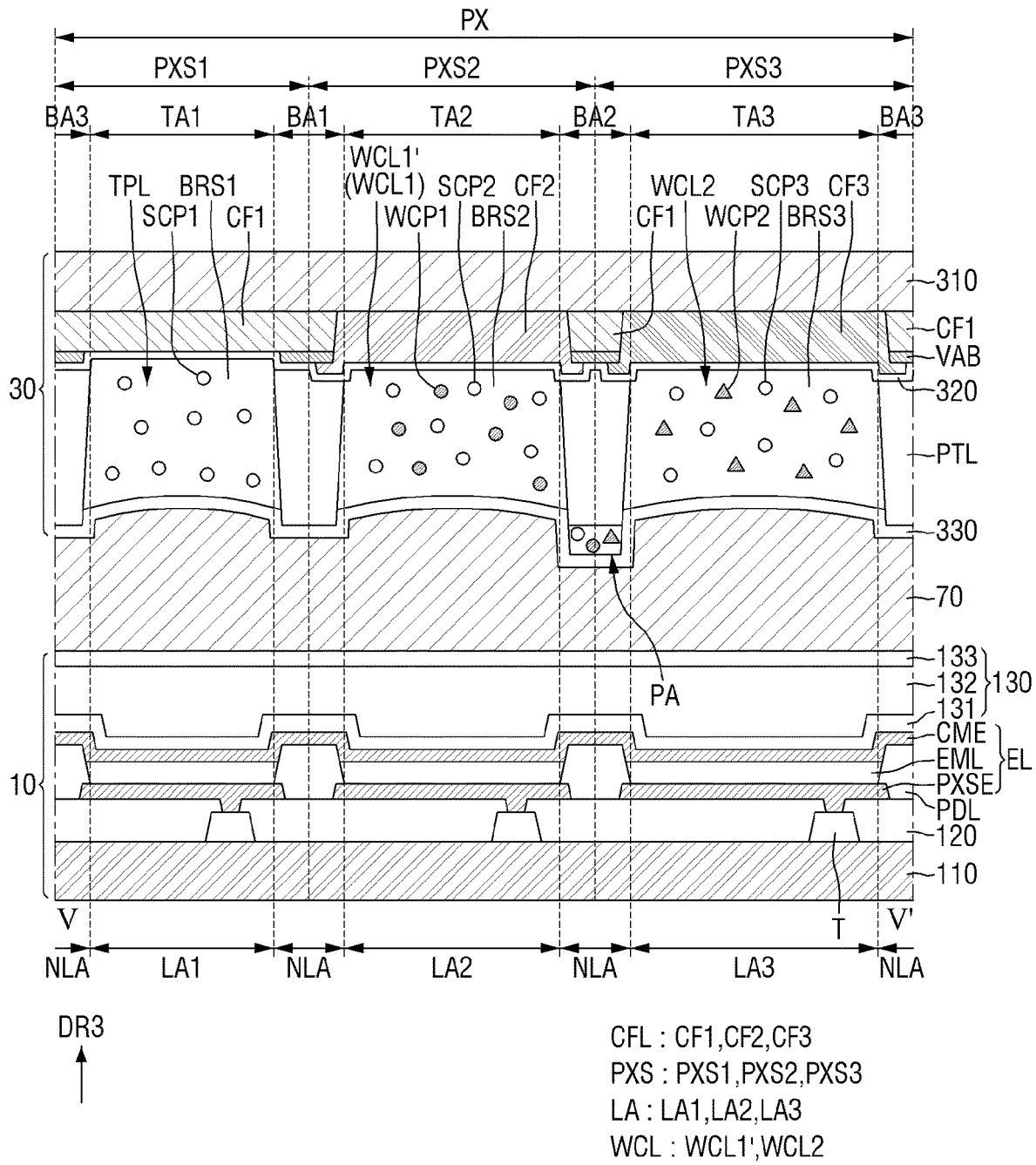
FIG. 14 is a cross-sectional view illustrating an example of a display device having undergone a repair process according to an embodiment.

FIG. 14 is a cross-sectional view illustrating an example of a display device having undergone a repair process according to an embodiment.

In the display device having undergone the repair process as shown in FIG. 14, it is illustrated that the residual mixed wavelength conversion layer may be disposed on the partition wall disposed in the second light blocking area.

For example, the residual mixed wavelength conversion layer PA may be disposed on the partition wall PTL disposed at the boundary between the second sub-pixel PXS2 and the third sub-pixel PXS3 where the repair process has been performed. The partition wall PTL on which the residual mixed wavelength conversion layer PA is disposed may overlap the second light blocking area BA2 disposed between the second light transmitting area TA2 and the third light transmitting area TA3. The residual mixed wavelength conversion layer PA may be disposed on a surface (for example, lower surface based on FIG. 14) of the partition wall PTL disposed in the second light blocking area BA2.

Referring to FIG. 14 together with FIG. 9, the residual mixed wavelength conversion layer PA may be formed due to mis-injection or overflow of ink in the process of forming the first wavelength conversion pattern WCL1 belonging to the second sub-pixel PXS2 and the second wavelength conversion pattern WCL2 belonging to the third sub-pixel PXS3. For example, in the mixed wavelength conversion material layer formed over the second sub-pixel PXS2 and the third sub-pixel PXS3, through a space partitioned by the partition wall PTL, due to the overflow of the ink, the residual mixed wavelength conversion layer PA may be formed because mixed wavelength conversion material layer remains without being removed in the process of removing the defective wavelength conversion pattern WCL1_D shown in FIG. 9.

The residual mixed wavelength conversion layer PA may include (e.g., be) a material included in the first wavelength conversion pattern WCL1 and a material included in the second wavelength conversion pattern WCL2. For example, the residual mixed wavelength conversion layer PA may include (e.g., be) a first wavelength conversion material WCP1 and a second wavelength conversion material WCP2. The residual mixed wavelength conversion layer PA may further include (e.g., be) a second scatterer SCP2 and/or a third scatterer SCP3.

The second capping layer 330 may cover the light transmission pattern TPL, the repair pattern WCL1', the second wavelength conversion pattern WCL2, the partition wall PTL, and the residual mixed wavelength conversion layer PA.

Figure 15:
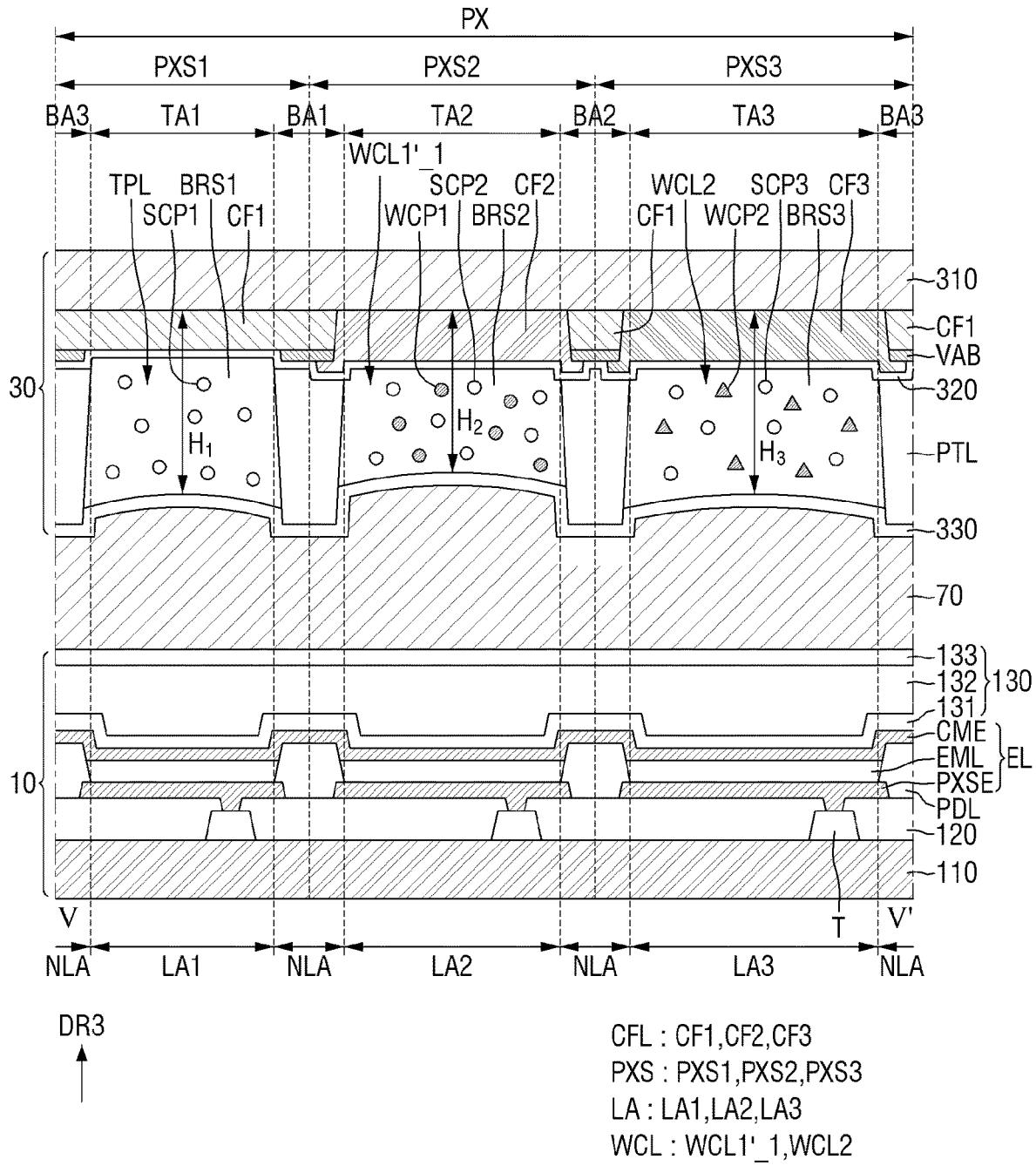
FIG. 15 is a cross-sectional view illustrating another example of a display device having undergone a repair process according to an embodiment.

FIG. 15 is a cross-sectional view illustrating another example of a display device having undergone a repair process according to an embodiment.

In the display device having undergone the repair process as shown in FIG. 15, it is illustrated that a level of a surface of the repair pattern may be different from a level of a surface of the wavelength conversion pattern and/or the light transmission pattern. The surface may be a surface of the color control layer facing the display substrate, for example, the lower surface of the color control layer in FIG. 15.

For example, a level H2 of a surface of the repair pattern WCL1'_1 disposed in the second light transmitting area TA2 of the second sub-pixel PXS2 having undergone the repair process may be different from a level H1 of a surface of the adjacent light transmission pattern TPL and/or a level H3 of a surface of the second wavelength conversion pattern WCL2. Further, the level H2 of the surface of the repair pattern WCL1'_1 may be different from the level of the surface of the first wavelength conversion pattern WCL1 (refer to FIG. 5) not having under the repair process. In this specification, the level of a surface may be defined as a distance from a surface of the second substrate 310 facing the first substrate 110 to the lower surface of the color control layers TPL, WCL1'_1, and WCL2. For example, the levels H1, H2, and H3 may be distances from a surface (e.g., lower surface, as shown in FIG. 15) of the second substrate 310 to the surface (e.g., lower surface, as shown in FIG. 15) of the light transmission pattern TPL, the surface of the repair pattern WCL1'_1, and the surface of the second wavelength conversion pattern WCL2, respectively.

Referring to FIG. 15 together with FIGS. 10 and 11, in the present embodiment, the repair pattern WCL1'_1, a surface thereof having different levels (e.g., a surface thereof having a level that may be controlled), may be formed by injecting ink into the space partitioned by the partition wall PTL in an amount different from the set or preset ink amount in the process of forming the repair material layer WCL1_R. For example, the repair pattern WCL1'_1, a surface thereof having different levels, may be formed by differently setting the injection amount (e.g., by controlling the injection amount) of the ink I in the process of forming the repair material layer WCL1_R by injecting the ink I including the first wavelength conversion material WCP1 into the groove OP corresponding to the second light transmitting area TA2 shown in FIG. 10. For example, the level of the repair pattern WCL1'_1 may be controlled by controlling the amount of ink injected into the groove OP. Although it is shown in the drawing that the level H2 of a surface of the repair pattern WCL1'_1 is smaller than the level H1 of a surface of the light transmission pattern TPL and/or the level H3 of a surface of the second wavelength conversion pattern WCL2, the present disclosure is not limited thereto. For example, the level H2 of the surface of the repair pattern WCL1'_1 may be greater than the level H1 of the surface of the light transmission pattern TPL and/or the level H3 of the surface of the second wavelength conversion pattern WCL2.

Figure 16:
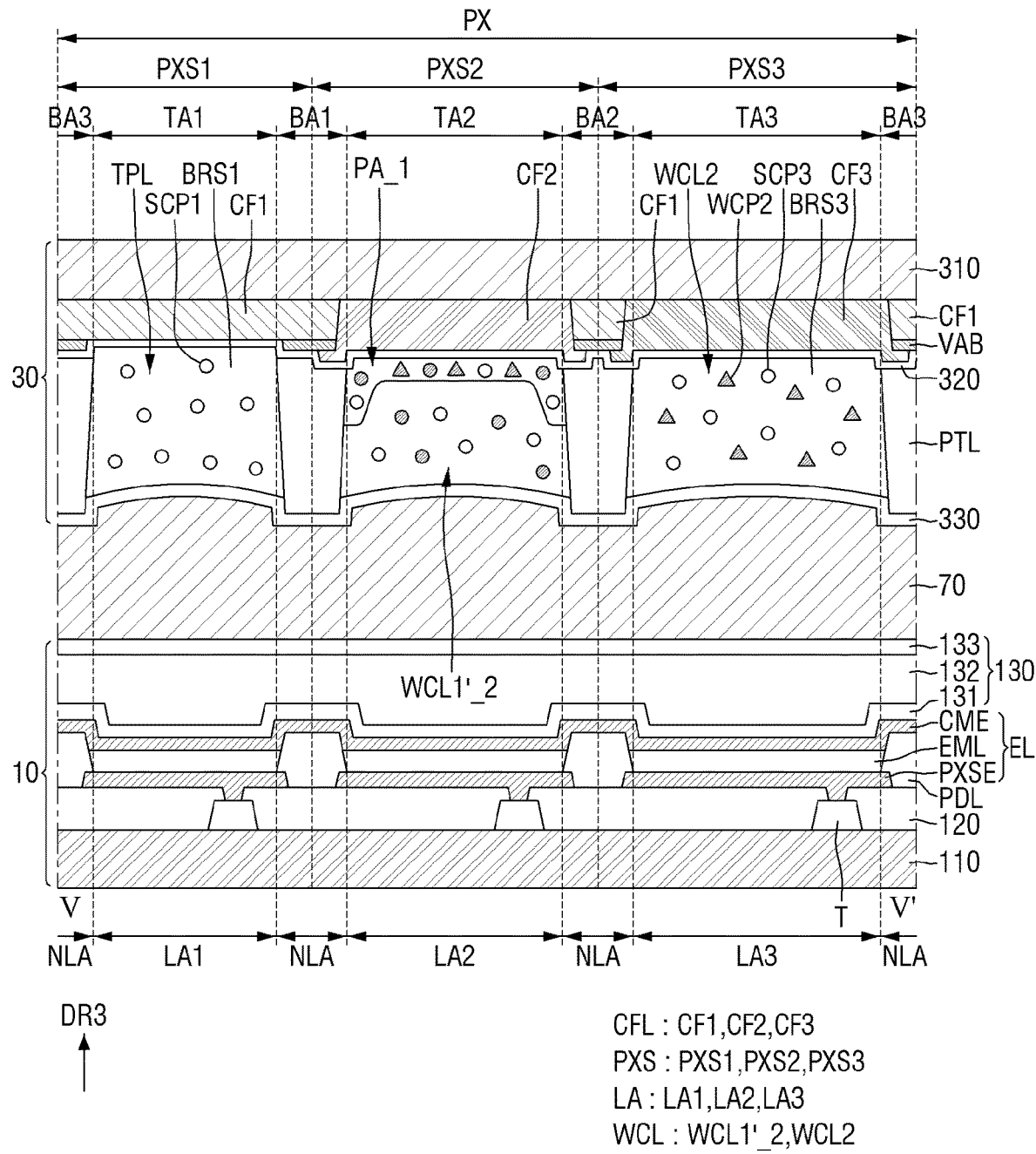
FIG. 16 is a cross-sectional view illustrating another example of a display device having undergone a repair process according to an embodiment.

FIG. 16 is a cross-sectional view illustrating another example of a display device having undergone a repair process according to an embodiment.

In the display device having undergone the repair process as shown in FIG. 16, it is illustrated that a residual mixed wavelength conversion layer may be disposed between the repair pattern and the second color filter in the second light transmitting area.

For example, a residual mixed wavelength conversion layer PA_1 may be disposed in the second light transmitting area TA2 of the second sub-pixel PXS2 having under gone the repair process. The residual mixed wavelength conversion layer PA_1 may be disposed between the second color filter CF2 and the repair pattern WCL1'_2 which are disposed in the second light transmitting area TA2 having under gone the repair process. The residual mixed wavelength conversion layer PA_1 may be disposed on one surface of the second color filter CF2 disposed in the second sub-pixel PXS2, and may extend outward to be disposed on a part of the side surface of the partition wall PTL disposed in the first light blocking area BA1 and the second light blocking area BA2. Although it is shown in FIG. 16 that the residual mixed wavelength conversion layer PA_1 is integrally formed, the present disclosure is not limited thereto. For example, the residual mixed wavelength conversion layer PA_1 may include two or more portions that are not physically connected to each other.

Referring to FIG. 16 together with FIG. 9, the residual mixed wavelength conversion layer PA_1 may be formed by remaining without completely removing the defective wavelength conversion pattern WCL1_D in the process of removing the defective wavelength conversion pattern WCL1_D. For example, only a portion of the defective wavelength conversion pattern WCL1_D may be removed such that a portion of the defective wavelength conversion pattern WCL1_D remains in the second light transmitting area TA2. The volume of the residual mixed wavelength conversion layer PA_1 disposed in the space overlapping the second light transmitting area TA2 partitioned by the partition wall PTL may be smaller than the volume of the repair pattern WCL1'_2. In an example embodiment, the ratio of the volume in which the residual mixed wavelength conversion layer PA_1 is disposed in the second light transmitting area TA2 to the volume of the space partitioned by the partition wall PTL in the second light transmitting area TA2 may be about 10% or less.

Figure 17:
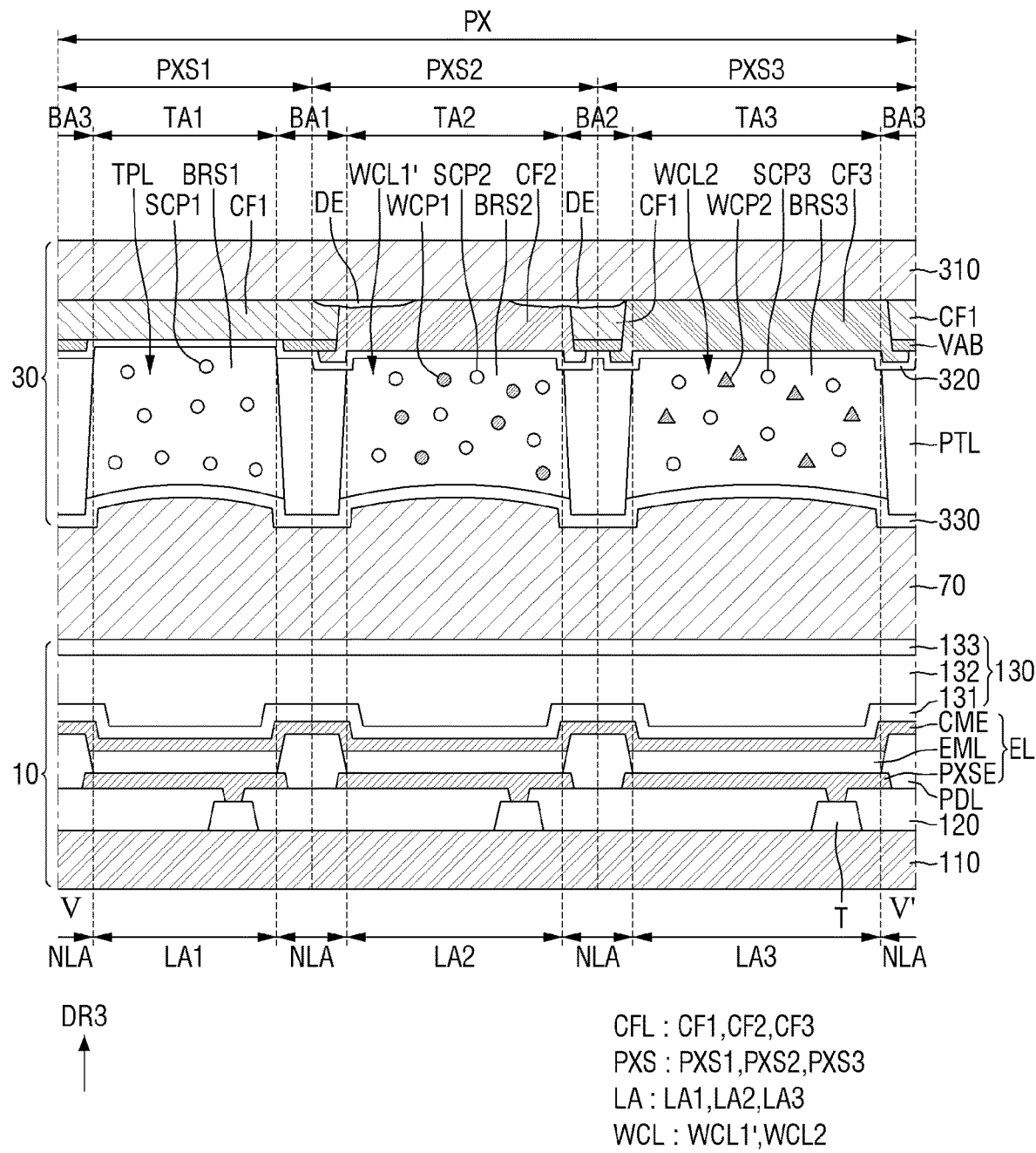
FIG. 17 is a cross-sectional view illustrating another example of a display device having undergone a repair process according to an embodiment.

FIG. 17 is a cross-sectional view illustrating another example of a display device having undergone a repair process according to an embodiment.

In the display device having undergone the repair process as shown in FIG. 17, it is illustrated that a lift-up phenomenon may occur in the color filter layer disposed on the second substrate included in the second sub-pixel.

For example, a lift-up phenomenon occurs in at least one selected from among the color filters CF1 and CF2 disposed in the second sub-pixel PXS2 having undergone the repair process, and thus a lift-up space DE may be formed between the second substrate 310 and at least one selected from among the color filters CF1 and CF2 disposed in the second sub-pixel PXS2.

Referring to FIG. 17 together with FIG. 9, the lift-up space DE may be formed by transferring the energy generated from the laser beam L1 in the process of removing the defective wavelength conversion pattern WCL1_D up to the second substrate 310 and the first and second color filters CF1 and CF2 disposed in the second sub-pixel PXS2

The lift-up space DE may be a fine space formed between the second substrate 310 and the color filter layer which are spaced apart from each other. For example, the lift-up space DE may be a space between the second substrate 310 and at least one selected from among the first and second color filters CF1 and CF2 disposed in the second sub-pixel PXS2. In some embodiments, the lift-up space DE may be a volume including empty space (e.g., a vacuum) or a gas, but the present disclosure is not limited thereto. The lift-up space DE may be formed between the second substrate 310 and the second color filter CF2 which are disposed to overlap the second light transmitting area TA2 of the second sub-pixel PXS2. The lift-up space DE may also be formed between the second substrate 310 and the first color filter CF1 (e.g., a portion of the first color filter CF1) which is disposed to overlap the first light blocking area BA1 and/or the second light blocking area BA2.

Figure 18:
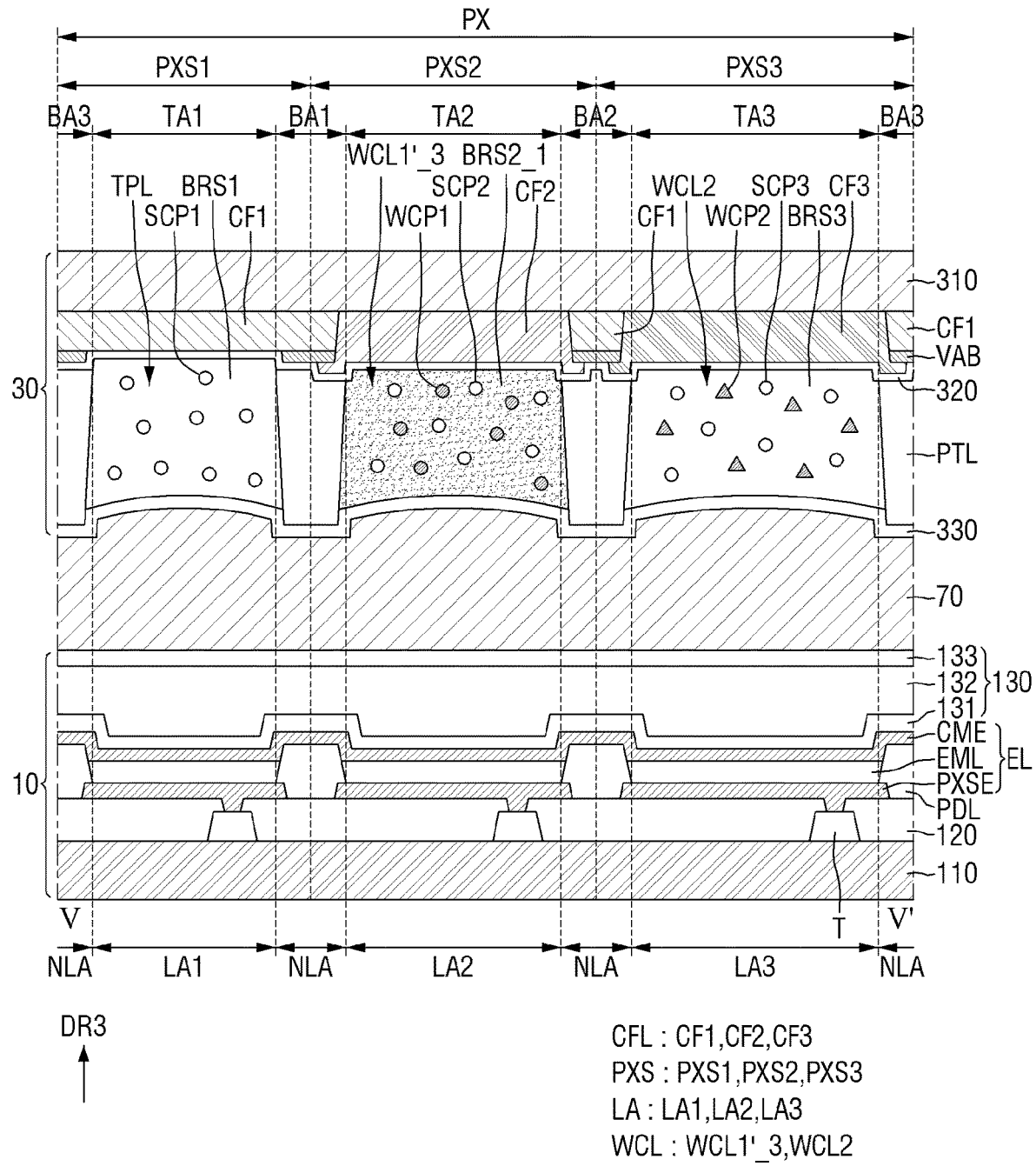
FIG. 18 is a cross-sectional view illustrating another example of a display device having undergone a repair process according to an embodiment.

FIG. 18 is a cross-sectional view illustrating another example of a display device having undergone a repair process according to an embodiment.

In the display device having undergone the repair process as shown in FIG. 18, it is illustrated that the viscosity of the repair pattern may be different from the viscosity of the first wavelength conversion pattern.

For example, the viscosity of the second base resin BRS2_1 included in the repair pattern WCL1'_3 disposed in the second light transmitting area TA2 of the second sub-pixel PXS2 having undergone the repair process may be different from the viscosity of the second base resin BRS2 (refer to FIG. 5) included in the first wavelength conversion pattern WCL1 disposed in the normal pixel. The repair pattern WCL1'_3 may include the second base resin BRS2_1, and a first wavelength conversion material WCP1 and a second scatterer SCP2 which are dispersed in the second base resin BRS2_1. In this embodiment, the second base resin BRS2_1 included in the repair pattern WCL1'_3 may include (e.g., be) the same material as the second base resin BRS2 shown in FIG. 5, but only the viscosity may be different.

Referring to FIG. 18 together with FIGS. 5 and 10, the repair pattern WCL1'_3 including the second base resin BRS2_1 having a different viscosity from the second base resin BRS2 included in the first wavelength conversion pattern WCL1 shown in FIG. 5 may be formed by a change in viscosity of the ink I due to a time difference between the process of forming the first wavelength conversion pattern WCL1 belonging to the second sub-pixel PXS2 and the second wavelength conversion pattern WCL2 belonging to the third sub-pixel PXS3 and the repair process thereof.

Figure 19:
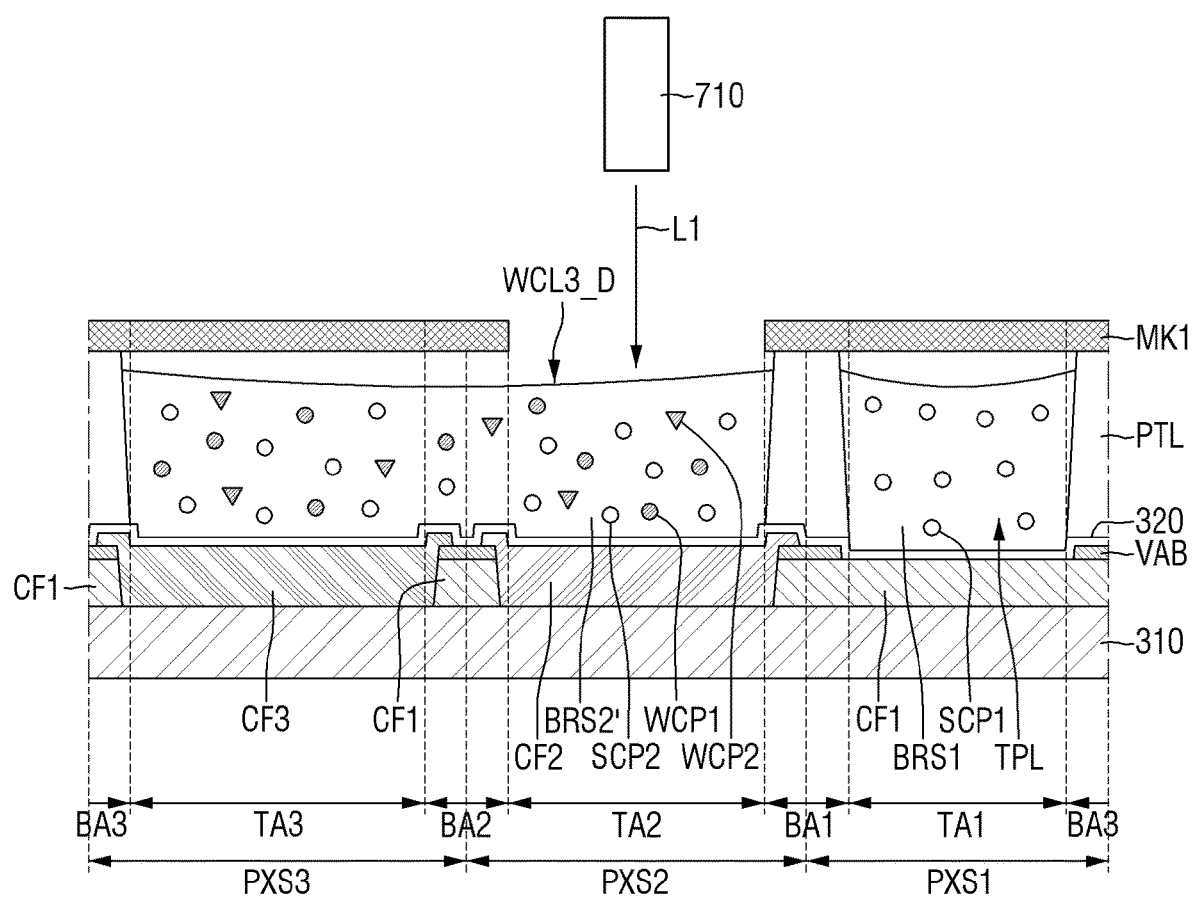
FIGS. 19 to 21 are cross-sectional views illustrating another example of a process of repairing a display device according to an embodiment.
Figure 20:
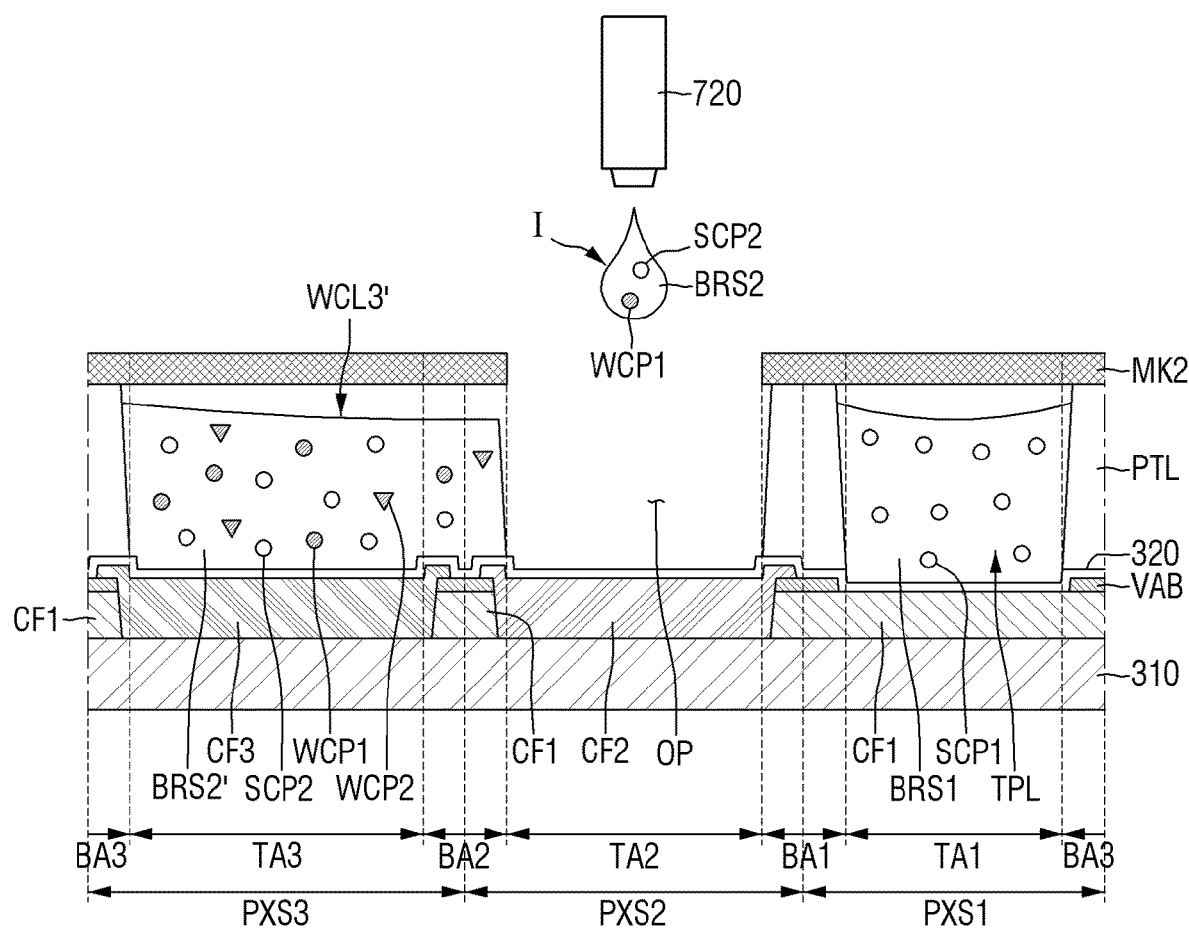
Figure 21:
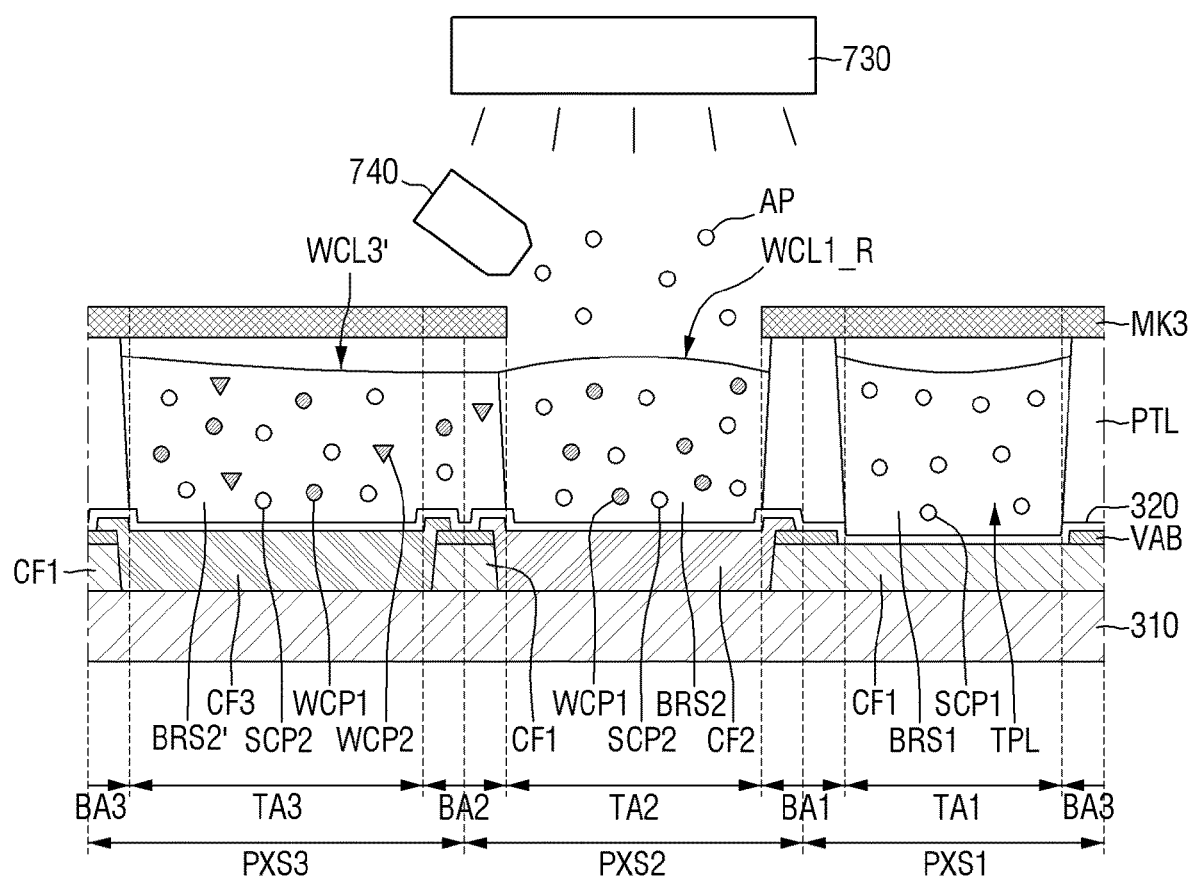

FIGS. 19 to 21 are cross-sectional views illustrating another example of a process of repairing a display device according to an embodiment.

Referring to FIG. 19, a wavelength conversion layer in which the first wavelength conversion material WCP1 and the second wavelength conversion material WCP2 are mixed may be disposed in the second sub-pixel PXS2 and the third sub-pixel PXS3. For example, the wavelength conversion layer WCL3_D in which a defect has occurred (hereinafter, defective wavelength conversion layer WCL3_D or mixed wavelength conversion layer WCL3_D) may be formed through the second light transmitting area TA2, the second light blocking area BA2, and the third light transmitting area TA3. The defective wavelength conversion layer WCL3_D shown in FIG. 19 may be formed by the loss of the partition wall PTL in an area overlapping the second light blocking area BA2 disposed between the second light transmitting area TA2 and the third light transmitting area TA3.

For example, the defective wavelength conversion layer WCL3_D may include a fourth base resin BRS2' in which the second base resin BRS2 and the third base resin BRS3 are mixed, and a second scatterer SCP2, a first wavelength conversion material WCP1 and a second wavelength conversion material WCP2 which are dispersed in the fourth base resin BRS2'. In some embodiments, the defective wavelength conversion layer WCL3_D may also include the third scatterer SCP3 shown in the second wavelength conversion pattern WCL2 of the third sub-pixel PXS3 of FIG. 5. For example, the defective wavelength conversion pattern WCL3_D, which is a wavelength conversion layer formed by mixing a material included in the first wavelength conversion pattern WCL1 disposed in the second sub-pixel PXS2 with a material included in the second wavelength conversion pattern WCL2 disposed in the third sub-pixel PXS3, may be a defective wavelength conversion layer causing dark spots in the display device 1.

Hereinafter, a method of repairing a display device including the color conversion substrate shown in FIG. 19 will be described. In the following embodiments, descriptions of the same processes as those already described with reference to FIGS. 9 to 12 may be simplified or may not be repeated, and differences in the configurations will be mainly described.

First, referring to FIG. 19, an area overlapping the second light transmitting area is removed from the defective wavelength conversion layer (or the mixed wavelength conversion layer) included in the second sub-pixel and the third sub-pixel (or defective pixel).

For example, the first mask MK1 is aligned between the laser unit 710 and the color conversion substrate 30, and then the laser beam L1 may be applied. The first mask MK1 may be disposed such that the transmission portion thereof is aligned with an area corresponding to the second light transmitting area TA2. The transmission portion of the first mask MK1 may be irradiated with the laser beam L1 to remove a part of the defective wavelength conversion layer WCL3_D overlapping the second light transmitting area TA2.

A part of the defective wavelength conversion layer WCL3_D overlapping the second light transmitting area TA2 may be removed to form a groove OP in the second light transmitting area TA2. A part of the defective wavelength conversion layer WCL3_D not overlapping the second light transmitting area TA2 may remain on the second substrate 310. The mixed wavelength conversion pattern WCL3' remaining by removing a part of the defective wavelength conversion layer WCL3_D may be disposed over the third light transmitting area TA3 and the second light blocking area BA2 as shown in FIG. 20.

Subsequently, referring to FIG. 20, a repair material layer is formed in the groove OP formed by a part of the defective wavelength conversion layer WCL3_D. For example, the groove OP may be partitioned or defined by the partition wall PTL in the first light blocking area BA1 and a sidewall of the mixed wavelength conversion pattern WCL3'.

For example, a repair material layer WCL1_R may be formed by an inkjet method in the groove OP formed by a part of the defective wavelength conversion layer WCL3_D. The inkjet nozzle 720 injects the ink I into a space in which the partition wall PTL and the mixed wavelength conversion pattern WCL3' disposed in the first light blocking area BA1 are partitioned. Accordingly, the repair material layer WCL1_R may fill the space in which the partition wall PTL and the mixed wavelength conversion pattern WCL3' disposed in the first light blocking area BA1 are partitioned.

Figure 22:
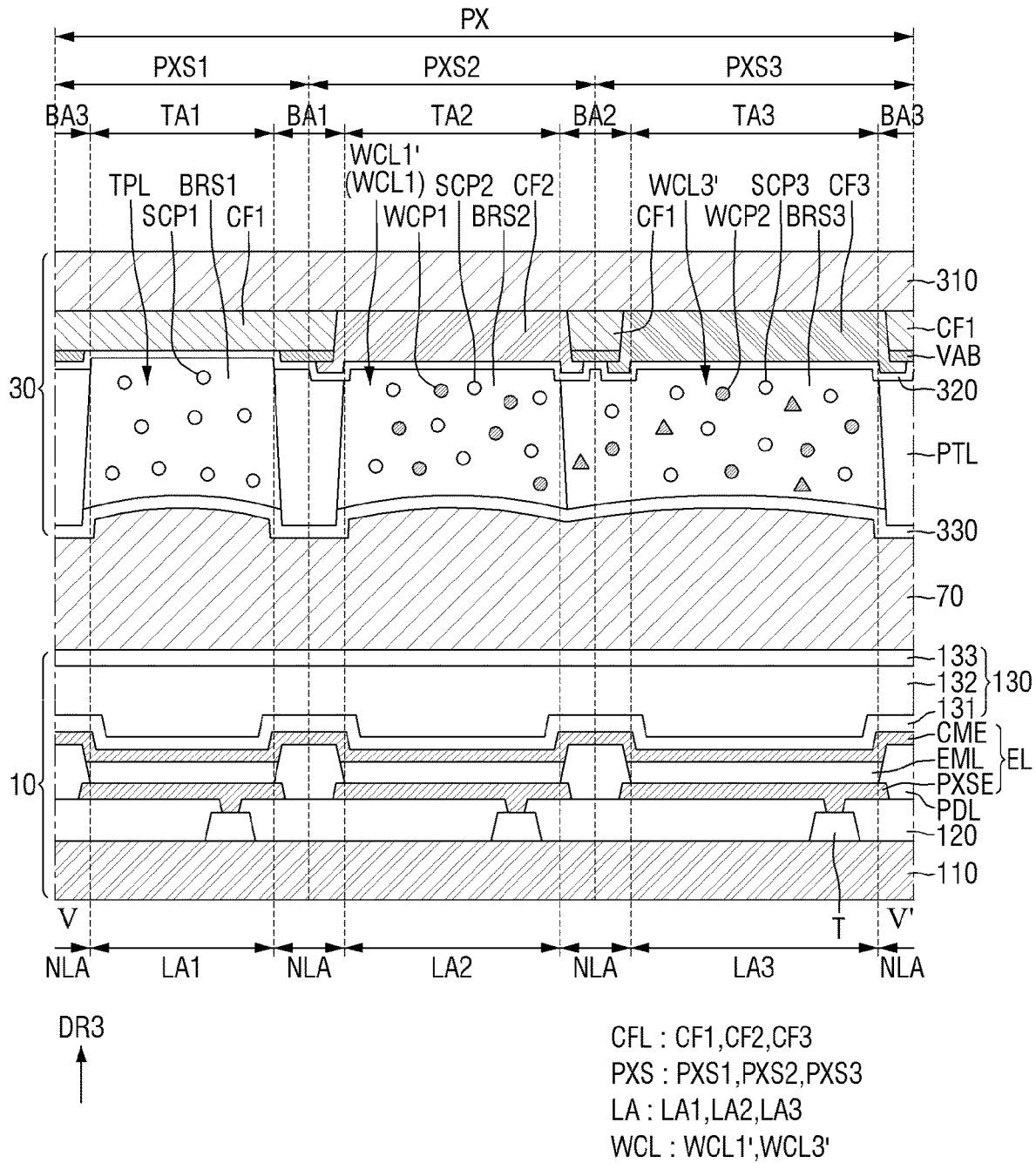
FIG. 22 is a cross-sectional view illustrating another example of a display device having undergone a repair process according to an embodiment.

Subsequently, referring to FIG. 21, the repair material layer WCL1_R may be cured to form a repair pattern WCL1'. The repair material layer WCL1_R may contact the mixed wavelength conversion pattern WCL3'. The repair material layer WCL1_R may be cured to form a repair pattern WCL1' having a structure as shown in FIG. 22 to be described in more detail later. The repair pattern WCL1' may contact the mixed wavelength conversion pattern WCL3' belonging to the adjacent third sub-pixel PXS3.

FIG. 22 is a cross-sectional view illustrating another example of a display device having undergone a repair process according to an embodiment.

In the display device having undergone a repair process as shown in FIG. 22, it is illustrated that a partition wall is not disposed in the second light blocking area, and color control layers belonging to the second sub pixel and the third sub pixel may contact each other.

For example, the repair pattern WCL1' disposed in the second light transmitting area TA2 of the second sub-pixel PXS2 having undergone a repair process may contact the mixed wavelength conversion pattern WCL3' disposed in the third light transmitting area TA3 of the adjacent third sub-pixel PXS3. In some embodiments, the mixed wavelength conversion pattern WCL3' may also be disposed in the second light blocking area BA2, and the repair pattern WCL1' may contact the mixed wavelength conversion pattern WCL3' at the border between the second light transmitting area TA2 and the second light blocking area BA2. A partition wall PTL may not be disposed in the second light blocking area BA2. Accordingly, the mixed wavelength conversion pattern WCL3' may be disposed to overlap the third light transmitting area TA3 and the second light blocking area BA2.

Referring to FIG. 22 together with FIG. 19, the mixed wavelength conversion pattern WCL3' may be formed by remaining without removing the defective wavelength conversion layer WCL3_D disposed in areas corresponding to the third light transmitting area TA3 and the second light blocking area BA2 in the process of removing the mixed wavelength conversion layer WCL3_D overlapping the second light transmitting area TA2.

The mixed wavelength conversion pattern WCL3' disposed in the third sub-pixel PXS3 may include (e.g., be) a material included in the first wavelength conversion pattern WCL1 and a material included in the second wavelength conversion pattern WCL2. For example, the mixed wavelength conversion pattern WCL3' may include (e.g., be) a first wavelength conversion material WCP1 and a second wavelength conversion material WCP2.

In some embodiments, the defective wavelength conversion layer WCL3_D disposed in the area overlapping the third light transmitting area TA3 may also be removed. In this case, the above-described repair process may also be performed in the third sub-pixel PXS3, thereby forming a repair pattern including (e.g., being) the second wavelength conversion material WCP2 in the third light transmitting area TA3. In this case, a repair pattern including a first wavelength conversion material WCP1 may be formed in the second light transmitting area TA2, and a repair pattern including a second wavelength conversion material WCP2 may be formed in the third light transmitting area TA3. Further, a mixed wavelength conversion pattern may remain and be disposed between the repair pattern disposed in the second light transmitting area TA2 and the repair pattern disposed in the third light transmitting area TA3. For example, the residual mixed wavelength conversion pattern including the first wavelength conversion material WCP1 and the second wavelength conversion material WCP2 may be disposed in the second light blocking area BA2 in a shape similar to the partition wall PTL.

In concluding the detailed description, those of ordinary skill in the art will appreciate that many suitable variations and modifications can be made to the disclosed embodiments without substantially departing from the principles of the present disclosure. Therefore, the disclosed embodiments of the present disclosure are used in a generic and descriptive sense only and not for purposes of limitation.

What is claimed is:

1. A method of repairing a display device, in which the display device comprises,
 a color filter, and a wavelength conversion layer on the color filter, configured to convert a wavelength of light incident on the wavelength conversion layer, and comprising a defective wavelength conversion pattern corresponding to a defective pixel area, the method comprising:

removing the defective wavelength conversion pattern of the defective pixel area and without removing the color filter;

injecting ink comprising a wavelength conversion material into the defective pixel area where the defective wavelength conversion pattern was removed; and curing the ink injected into the defective pixel area.

2. The method of claim 1, wherein, in the removing of the defective wavelength conversion pattern, the defective wavelength conversion pattern is removed by irradiating the defective wavelength conversion pattern with a laser beam.

3. The method of claim 2, wherein the laser beam is applied utilizing a laser unit, and the laser unit includes a nano laser or a femtosecond laser.

4. The method of claim 1, wherein the display device further includes a substrate on which the color filter is disposed, and a partition wall on a surface of the color filter, and the defective wavelength conversion pattern is on the surface of the color filter in a space partitioned by the partition wall.

5. The method of claim 4, wherein, in the removing of the defective wavelength conversion pattern, the defective wavelength conversion pattern is removed by irradiating the defective pixel area with a laser beam to selectively remove only the defective wavelength conversion pattern without removing the color filter.

6. The method of claim 4, wherein the color filter is to selectively transmit light of a first color, and the wavelength conversion material includes a material to convert light of a second color different from the first color into light of the first color.

7. The method of claim 1, wherein the removing of the defective wavelength conversion pattern comprises: forming a groove in the defective pixel area by removing the defective wavelength conversion pattern, and the injecting of the ink comprises: forming a repair material layer including the wavelength conversion material by filling the groove with the ink including the wavelength conversion material.

8. The method of claim 7, wherein the curing of the ink comprises: forming a repair pattern by irradiating the repair material layer with light.

9. The method of claim 8, further comprising:

inspecting a height of the repair pattern after forming the repair pattern.

10. The method of claim 1, wherein the curing of the ink comprises: applying light to the ink in a state in which gas is introduced in the defective pixel area.

11. The method of claim 1, further comprising:

detecting a pixel area in which a defect has occurred before removing the defective wavelength conversion pattern.

12. A method of repairing a display device, in which the display device comprises, a color filter, and a wavelength conversion layer on the color filter, configured to convert a wavelength of light incident on the wavelength conversion layer, and comprising a mixed wavelength conversion pattern configured to convert a wavelength of light incident on the mixed wavelength conversion pattern, the method comprising:

removing the mixed wavelength conversion pattern without removing the color filter; and forming a repair pattern in a groove formed by the removing of the mixed wavelength conversion pattern.

13. The method of claim 12, wherein the mixed wavelength conversion pattern includes a first wavelength conversion material to convert light of a first color into light of a second color and a second wavelength conversion material to convert the light of the first color into light of a third color, and the repair pattern includes the first wavelength conversion material and does not include the second wavelength conversion material.

14. The method of claim 13, wherein the removing of the mixed wavelength conversion pattern comprises: irradiating the mixed wavelength conversion pattern with a laser beam.

15. The method of claim 13, wherein the forming of the repair pattern comprises:

forming a repair material layer including the first wavelength conversion material in the groove; and forming the repair pattern by curing the repair material layer.

16. The method of claim 15, wherein the forming of the repair material layer in the groove comprises injecting ink including the first wavelength conversion material into the groove.

17. A display device comprising a pixel which comprises a first sub-pixel configured to display a first color and a second sub-pixel configured to display a second color, the display device comprising:

a color conversion substrate, the color conversion substrate comprises:

a first substrate;

a color filter on a surface of the first substrate;

a color control layer on a surface of the color filter and comprising a wavelength conversion layer configured to convert a wavelength of light incident on the wavelength conversion layer, the wavelength conversion layer comprising a first wavelength conversion pattern belonging to the first sub-pixel and a repair pattern belonging to the second sub-pixel; and a mixed wavelength conversion layer between the first substrate and the repair pattern and configured to convert a wavelength of light incident on the mixed wavelength conversion layer.

18. The display device of claim 17, wherein the mixed wavelength conversion layer comprises a first wavelength conversion material to convert light of a third color into light of the first color and a second wavelength conversion material to convert light of the third color into light of the second color, and the repair pattern comprises the second wavelength conversion material and does not comprise the first wavelength conversion material.

19. The display device of claim 18, further comprising:

a display substrate to face the color conversion substrate, wherein the display substrate comprises:

a second substrate facing the first substrate, a sub-pixel electrode on a surface of the second substrate facing the first substrate and provided for each sub-pixel, a pixel defining layer on the second substrate along a boundary of the sub-pixel and exposing the sub-pixel electrode, a light emitting layer on the sub-pixel electrode exposed by the pixel defining layer, and a common electrode on the light emitting layer.

20. The display device of claim 18, wherein the pixel further comprises a third sub-pixel configured to display a third color, and wherein the color control layer further comprises a light transmission pattern belonging to the third sub-pixel.

* * * * *